United States Patent [19]

Katsuda et al.

[11] Patent Number: 5,698,363
[45] Date of Patent: Dec. 16, 1997

[54] IMAGE FORMING METHOD

[75] Inventors: Ai Katsuda; Hiroshi Watanabe; Tomonori Kawamura; Toshihisa Takeyama; Kunihiro Koshizuka, all of Hino, Japan

[73] Assignee: Konica Corporation, Japan

[21] Appl. No.: 682,931

[22] Filed: Jul. 8, 1996

[30] Foreign Application Priority Data

Jul. 10, 1995 [JP] Japan .................. 7-173510

[51] Int. Cl.$^6$ .................. G03C 1/67; G03C 1/735; G03C 7/00; G03C 8/08
[52] U.S. Cl. .................. 430/200; 430/199; 430/201; 430/203; 430/235; 430/254; 430/332; 430/336; 430/936; 430/964; 427/261; 427/264; 427/270; 503/227
[58] Field of Search .................. 430/199, 200, 430/203, 336, 254, 936, 201, 332, 235, 964; 503/227; 427/261, 270, 264

[56] References Cited

U.S. PATENT DOCUMENTS

| | | | |
|---|---|---|---|
| 3,484,238 | 12/1969 | Fox | 430/203 |
| 4,243,737 | 1/1981 | DoMinh | 430/203 |
| 4,247,625 | 1/1981 | Fletcher et al. | 430/936 |
| 4,314,019 | 2/1982 | Adin et al. | 430/203 |
| 4,334,005 | 6/1982 | Adin et al. | 430/203 |
| 4,548,897 | 10/1985 | DoMinh | 430/936 |
| 5,360,781 | 11/1994 | Leenders et al. | 430/200 |
| 5,476,755 | 12/1995 | Nakayama et al. | 430/936 |

*Primary Examiner*—Richard L. Schilling
*Attorney, Agent, or Firm*—Jordan B. Bierman; Bierman, Muserlian and Lucas LLP

[57] ABSTRACT

An image forming method is disclosed. In the method, an image-forming element comprising a support provided thereon a first layer containing substantially of one or two components selected from three kinds of components, (1) a cobalt (III) complex having an ammonia ligand or a primary amine ligand, (2) a compound capable of being changed in the absorption wavelength thereof by ammonia or primary amine and (3) a compound or a precursor thereof which makes ammonia or primary amine contained in the cobalt (III) complex as a ligand to be easily released from the complex is used, and the method comprises the steps of;

imagewise providing the component or components other than the one or two components selected from the three kinds of components contained substantially in the first layer to the first layer according to image-information, and reacting components selected from the three kinds of components contained substantially in the first layer and the component or components other than the one or two components selected from the three kinds of components provided imagewise to the first layer, to form an image.

19 Claims, 7 Drawing Sheets

IMAGE FORMING METHOD

FIELD OF THE INVENTION

The present invention relates to a novel method for forming an image and to an element used therein, more specifically relates to a novel method for forming an image by applying energy according to image-information in which a cobalt(III) complex is applied, and an image-forming element and an image transferring element to be used in the method.

BACKGROUND OF THE INVENTION

Recently, a fusion-type heat transfer method and heat-diffusible dye transfer method has been known as dry image-forming methods without necessity of processing by any liquid developer, in which a transferring element having a coated layer composed of a vehicle containing a dye or pigment is imagewise heated to form an image on a imaged receiving element. In these methods, however, a problem has been raised that a high energy is necessary to transfer an image since transferring a relatively large amount of pigment or dye is required to form an image having a satisfactory image density. To solve the problem such as above, some image forming methods have been proposed for obtaining an image with a satisfactory image density by means of a small amount of energy.

For example, it is known that a cobalt(III) complex is easily reduced by light to a cobalt(II) complex having a lower stability constant of ligand. An image-forming element utilizing the above-mentioned property of the cobalt (III) complex is described Japanese Patent Publication Open for Public Inspection (JP O.P.I.) Nos. 50-139722/1975, 50-139723/1975, 50-139724/1975, 52-101026/1977 and 57-63527/1982, in each of which (1) a cobalt(III) complex, (2) a photoreducing agent and (3) a phthalaldehyde are contained. The elements described in these patent publications are excellent on the point that an image can be formed by a simple dry-processing. Although an image can be formed by heating after an imagewise light-exposure in such the elements, a fixing treatment is required after the image formation because the photo-reducing agent is contained.

Besides, in Japanese examined Patent Publication (JP) No. 54-500062/1979 and JP P.O.I. No. 56-72436/1981, another method in which color formation is inhibited or inactivated by means of an agent capable of forming an acid by light and color is formed by a reducing agent at a portion at which the inhibition of color formation is not occurred. Further, a method is described in JP O.P.I. Nos. 57-51489/1982 and 57-63527/1982, in which an image is formed by heating a element containing an agent for making unstable a cobalt complex. This method has an advantage that any fixing treatment is not necessary for formed image, but the it cannot be recognized as a satisfactory method.

The above-mentioned methods are not satisfactory in the easiness of handling and of the image-forming element and in the storage ability of the formed image since the method is relying on the latent image formation by light. Further, there are problems of coloring by the addition of the photo-reducing agent or the acid-forming agent by light, or spectral sensitizer added according to necessity. Accordingly, further improvement is demanded from the view point of as above.

SUMMARY OF THE INVENTION

The object of the invention is to improve the above-mentioned problems. The object of the invention is to provided a method for forming an image in which an image can be simply and safely formed by a dry process, and an method capable forming an image having a high storage ability. Namely, the object of the invention is to provide an image forming method, and a element to be used in the method which has a high storage ability and is able to be easily handled in a lighted room and does nor requires any fixing treatment after development.

The object of the invention is attained by an image forming method using an image-forming element comprising a support provided thereon a first layer containing substantially of one or two components selected from three kinds of components, (1) a cobalt (III) complex having an ammonia ligand or a primary amine ligand, (2) a compound capable of being changed in the absorption wavelength thereof by ammonia or primary amine and (3) a compound or a precursor thereof which makes ammonia or primary amine contained in the cobalt (III) complex as a ligand to be easily released from the complex, wherein said method comprises the steps of;

imagewise providing the component or components other than the one or two components selected from the three kinds of components contained substantially in the first layer to the first layer according to image-information, and reacting components selected from the three kinds of components contained substantially in the first layer and the component or components other than the one or two components selected from the three kinds of components provided imagewise to the first layer, to form an image.

Hereinafter, three kinds of components essentially used in the invention, i.e., (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex are optionally referred as simply Component 1, Component 2 and Component 3, respectively.

In the present invention, the first layer cannot form any image by oneself. Namely, the method of the invention is based on the image-forming system in which an image can be formed only by the presence of all of the three kinds of essential Components 1 through 3. Accordingly, the image cannot be formed in the first layer because the first layer substantially contains only one or two of the essential components and does not substantially contain all the essential Components 1 through 3. The phrase of "does not substantially contain all the essential components" means that at least one of the three essential components is not contained in the image-forming layer in an amount as much as necessary to form an apparent density of image. Accordingly, the case in which the amount of at least one kind of the essential component is lower than that necessary to form an apparent image density, in included in the scope of the invention even though the three essential components are contained in the first layer.

The followings are preferable embodiments of the present invention.

1. An image forming method comprising the steps of applying energy according to image-information to an image forming element comprising a color-forming layer containing one or two components selected from three kinds of components, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex; a transferring layer containing components/component other than the one or two of the three kinds of components contained in the color-forming layer, provided on a support in the this order, peeling off the transferring layer from the image-forming layer to form a portion at which the three kinds of Components 1 through 3 are contained and another portion at which one or two of Components 1 to 3 are contained, on the image-forming element, and heating the image-forming element to form an image on the image-forming element.

2. An image forming method comprising the steps of superimposing a color-forming layer of a image-forming element comprising a support, having thereon, the color-forming layer containing one or two components selected from three kinds of components, (1) a cobalt (III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex with a transferring layer of a transferring element comprising a substrate having thereon the transferring layer containing the component/components other than the one or two of the three kinds of components contained in the color-forming layer, applying energy according to image-information to them, separating the image-forming element and the transferring element to form a portion at which the three kinds of Components 1 through 3 are contained and another portion at which one or two of Components 1 to 3 are contained, on the image-forming element, and heating the image-forming element to form an image on the image-forming element.

3. An image forming method comprising the steps of superimposing a transferring layer of a transferring element comprising a support, having thereon, a transferring layer containing one or two of (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex; and an image-receiving layer of an intermediate transferring medium comprising a substrate different from the above support, having thereon, the image-receiving layer, applying energy according to image-information to them separating the intermediate transferring medium and the transferring medium to form portion at which one or two of Components of 1 to 3 are contained, on the intermediate transferring medium, superimposing the image-receiving layer of the intermediate transferring medium to a color-forming layer of a color-forming element comprising a support, having thereon, the color-forming layer containing components/component other than the one or two of the three kinds of components contained in the transferring layer, and heating the image-forming element to form an image on the image-forming element.

4. An image forming method comprising the steps of applying energy according to image-information to an image-forming element comprising a support, a color-forming layer containing one or two of (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex; and a transferring layer containing components/component other than the one or two of the three kinds of components contained in the color-forming layer, provided on the support in the above order, to ablate imagewise the transferring layer, and heating the image-forming element to form an image on the image-forming element.

5. An image forming method comprising the steps of applying energy according to image-information to an image-forming element comprising a support, having thereon, a color-forming layer containing one or two of (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex and a ablating layer provided in this order, to ablate imagewise the ablating layer, superimposing the ablating layer of the image-forming element with a transferring layer of a transferring element comprising a substrate, having thereon, the transferring layer, and heating them, separating the image-forming element from the transferring element to form an image on the image-forming element, or applying energy according to image-information to a transferring element having a substrate, having there on, a transferring layer containing one or two of (1) a cobalt (III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex, and a ablating layer to imagewise ablate the ablating layer, superimposing the ablating layer of the transferring element with an image-forming layer of an image-forming element comprising a support, having thereon, the color-forming layer containing components/component other than the one or two of the three kinds of components contained in the transferring layer with the transferring layer of the transferring element comprising a and heating them, separating the image-forming element to form an image on the image-forming element.

DETAILED DESCRIPTION OF THE INVENTION

Figure 1:
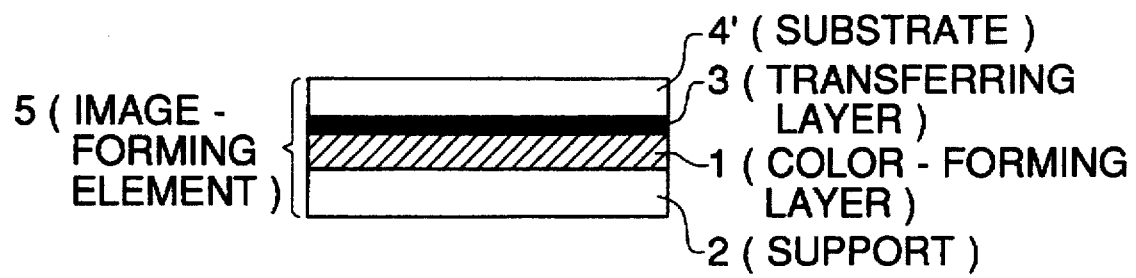
FIG. 1 shows an example of process of image formation of the invention
Figure 1:
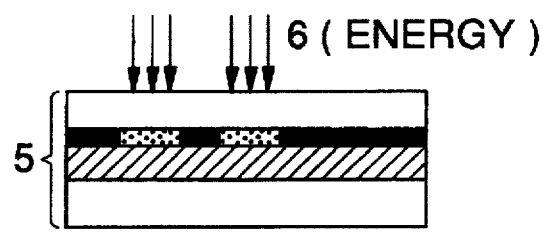
Figure 1:
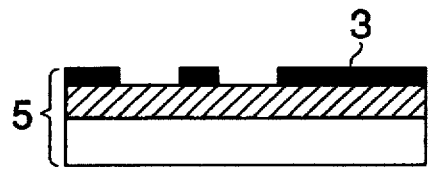
Figure 1:
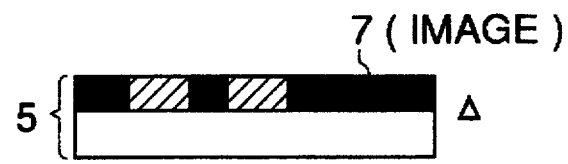

According to the invention, an image having a high storage ability can be safely and easily formed by a dry process by means of applying energy according to image-information to various combination of elements each containing the essential components. Namely, advantages such as the element can be easily handled in a lighted room and the fixation treatment after development is become not necessary, are obtained.

The method of the invention and the element to be used therefor are described in detail below.

(1) Image-Forming Method

The image-forming method of the invention includes a step for forming a portion containing three Components (1) through (3) and another portion containing one or two components selected from the three components, and is classified five kinds of method which are each described in accordance with drawings below.

1) First Embodiment

In this embodiment, as is shown in FIG. 1a, an image is formed by means of an image-forming element 5. The image-forming element 5 is composed of a color-forming layer 1, as a first layer of the present invention, containing one or two components selected from three components, (1) a cobalt(III) complex having an ammonia ligand or a primary amine ligand, (2) a compound capable of being changed in the absorption wavelength thereof by ammonia or the primary amine, and (3) a compound and/or a precursor thereof which makes ammonia or primary amine contained in the cobalt(III) complex as a ligand to be easily released from the complex, and a transfer layer 3, as a second layer of the present invention, containing components/component other than the one or two of the three kinds of components contained in the color-forming layer, provided on a support 2 in this order. In the process of transferring the components of the transferring layer, it is allowed to transfer the whole transferring layer or transfer only components selected from the above (1) to (3) contained in the transferring layer to the color-forming layer according to image-information.

FIG. 1 shows an example in which the transferring layer is wholly transferred imagewise. In the example shown in FIG. 1, a substrate 4' is laminated so that the transferring layer in which the transferring layer is a polymerizable layer can be easily released for transferring.

Figure 2:
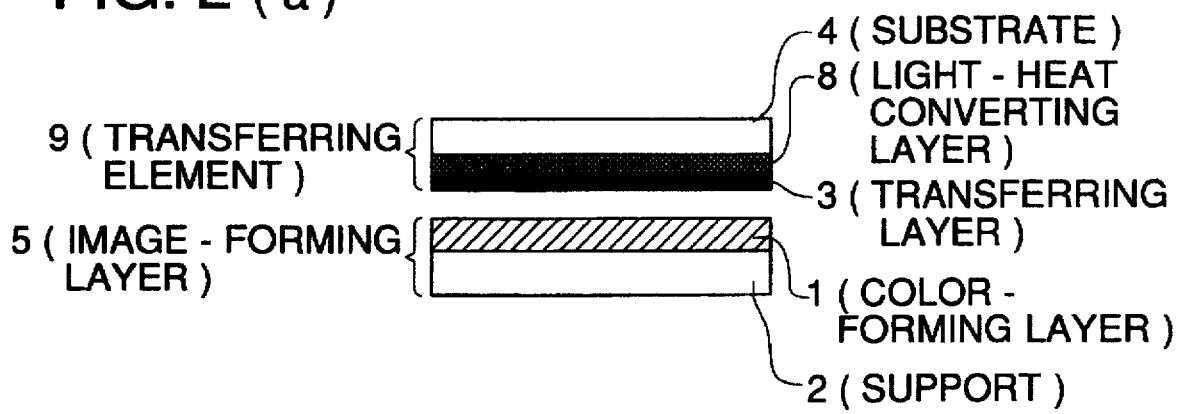
FIG. 2 shows an example of process of image formation of the invention
Figure 2:
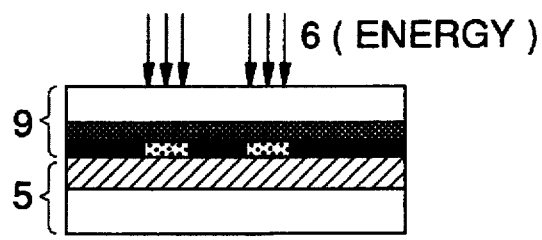
Figure 2:
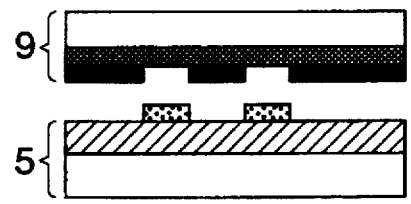
Figure 2:
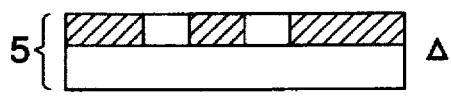
Figure 2:
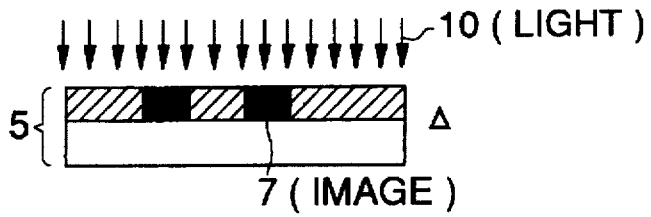

The first, the adhesion force at the interface of the polymerizable transferring layer 3 and substrate 4' is strengthen by applying energy according to image-information as shown in FIG. 1b. Then the substrate 4' is peeled off from the color-forming layer so that the portion of transferring layer at which the adhesion force is strengthen by heating according to the image-information is peeled off together with the substrate 4' and the image-forming element 5 is obtained on which a non-heated portion of the transferring layer 3 was only remained as a latent image as shown in FIG. 1c. Next, the transferring layer and the color-forming layer is mixed by heating (in the figures, heating is represented by Δ). Namely, Component 3 is reacted with Component 1 and ammonia and/or primary amine being as the ligand of the complex is released as a result of mixing of Components 1, 2 and 3. The released ammonia and/or primary amine is reacts with Component 2 and the absorption wavelength of Component 2 is shifted. Thus a visible image 7 shown in FIG. 2d is formed. Here, the term of "mixing" means mixing of the composition forming the transferring layer and that forming the color-forming layer by thermal fusion, and mixing of Components 1, 2 and 3 by thermal diffusion.

In this embodiment, for example, a means such as a thermal head, electric current-supplying head or electromagnetic wave having an wavelength of 1 nm to 1 mm may be optionally used for applying energy according to image-information. Any heating means can be used as long as which is one capable of making difference of the adhesion force, since a heating treatment is included in this embodiment at the last stage of the process and the sufficient image density is formed in this treatment.

It is preferred for obtaining a high resolution image, for example, electromagnetic wave such as ultraviolet-ray, visible light or infrared-ray having a wavelength of 1 nm to 1 mm because the energy applying area can be made narrow when the electromagnetic wave is used as the energy. As a light source applying such energy, a laser, light-emission diode, xenon flash lump, halogen lump, carbon arc lump, metal halide lump, tungsten lump, quartz mercury lump or high pressure mercury lump can be exemplified.

The amount of energy can be optionally set by controlling the distance of energy source, exposure time and energy intensity in accordance with the kind of image-forming element.

When the energy is applied by one-shot exposure, the image forming element is faced with a mask on which a negative pattern of a required image is formed by a light-shielding element and the exposure is given to them.

Digital exposure according to image-information can be carried out when an alley type light source such as light-emission diode alley is used as the light-source or a light source such as a halogen lump, metal halide lump or tungsten lump is used in combination with an optical shutter such as a liquid crystal or PLZT to be used as an exposure controlling means. In such the case, an image can be directly written without any masking element.

Exposure by laser light scanning is suitable for direct writing because the wavelength of the light can be optionally selected to adjust to the spectral sensitivity of the image forming element, and light can be condensed to a light beam and the scanning exposure can be carried out by means of the light beam. Further, the exposure area can be made to very narrow and formation of a high resolution image can be realized. As the laser light source, well known solid lasers such as a ruby laser, YAG laser and glass laser, gas lasers such as He—Ne laser, Ar laser, Kr laser, $CO_2$ laser, CO laser, He—Cd laser, $N_2$ laser and eximer laser, a semiconductor laser such as InGaP laser, AlGaAs laser, GaAsP laser, InGaAs laser, InAsO laser, $CdSnP_2$ laser and GaSb laser can be described. Among these lasers, ones emitting a wavelength of 600 nm to 1200 nm is more preferred for converting light energy to heat energy with a high efficiency.

Although direction of exposure by a laser can be given either side of the image-forming element, it is preferable to give from the side of the substrate 4' from the viewpoint of energy efficiency.

In the above-mentioned image-forming method, the image formation is carried out by heating the image-forming element after the latent image formation. In this case, any heating means can be used without any limitation, as long as which is one capable of uniformly and sufficiently heating the image-forming element.

As the heating means, one giving only heat such as an oven, thermal head or heating pen, and one giving such as a heating roll or hot tamper, are also can be used. Among them heating roll and hot stamper are preferably used for uniformly mixing the Components 1 through 3, by which heat and pressure can be applied at the same time.

When the heating roller is used, the heating temperature is generally 60° to 200° C., preferably 80° to 180° C., the transporting speed is generally 0.1 to 100 mm/sec., preferably 5 to 50 m/sec., and the pressure is generally 0.1 to 20 kg/cm, preferably 0.5 to 10 kg/cm. When the hot stamper is used, the heating temperature is generally 60° to 200° C., preferably 80° to 150° C., and the pressure is generally 0.05 to 10 kg/cm$^2$, preferably 0.5 to 5 kg/cm$^2$ and the heating time is generally 0.1 to 300 seconds, preferably 0.5 to 100 seconds.

A protective layer may further be provided on the surface of thus formed image to provide a durability to the surface of the image. In this case, for example, image 19 having a image-protective layer can be made by superimposing the surface of the color-forming layer of the image-forming element and a adhesive layer of a protective layer transferring element 18 which is composed of a substrate 4" and an adhesive layer 17 provided on the substrate, and applying pressure and optionally heating.

For this purpose, a pressing roll and pressing stamper can be used as a press applying means. Although condition of applying pressure cannot be sweepingly set since the condition is changed dependent on a factor such as the raw element of the surface of the pressing device, the transporting speed is generally 0.1 to 200 mm/sec., preferably 0.5 to 100 mm/sec., and the pressure is generally 0.1 to 20 kg/cm, preferably 0.5 to 10 kg/cm, when the pressure roll is used. When the pressure stamper is used, the pressure is generally 0.05 to 10 kg/cm$^2$, preferably 0.5 to 5 kg/cm$^2$, and the applying time is generally 0.1 to 20 seconds, preferably 0.5 to 10 seconds.

When treatment is carried out by applying pressure and heat, a means is can be used which is described as the heating means for heating the image-forming element after the latent image formation.

Figure 7:
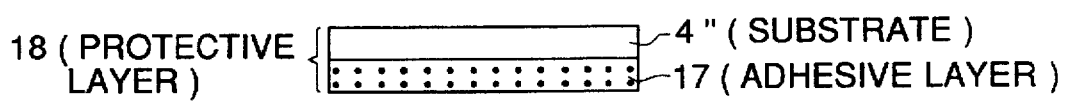
FIG. 7 shows a process for providing a protective layer.
Figure 7:
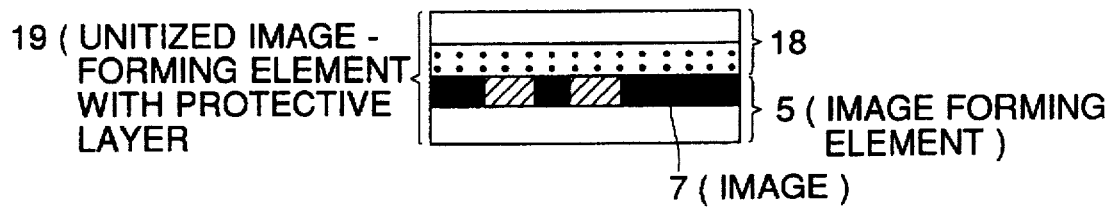

Although an element composed of a substrate and a adhesive layer is used in FIG. 7 as a protective layer, an element such as a transferring foil may be optionally used, by which a resin layer is solely transferred. The process of heating the image-forming element after the latent image formation and the process of heating and applying pressure for transferring the protective layer transferring element may be performed in the same processing step.

2) Second Embodiment

In this embodiment, as is shown in FIG. 2a, an image id formed by means of an image forming element 5 and a transferring element 9. The image-forming element 5 comprises a support 2 and a color-forming layer 1 which is provided on the support and contains one or two component selected from three kinds of components, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex. The transferring element comprises a substrate 4 and a transferring layer 3 which is provided on the substrate and contains components/component other than the one or two of the three kinds of components contained in the color-forming layer of the color-forming element.

FIG. 2a shows a case in which the transferring layer is wholly transferred. In this case, a light-heat converting layer 8 for direct writing by laser is provided between a transferring layer 3 and a substrate 4 of the transferring element, and the transferring layer is a heat-fusible transferring layer and contains a photo-reducing agent as Component 3.

First, the color-forming layer 1 of the image-forming element is faced with the transferring layer 3 of the transferring element as shown in FIG. 2b, and laser light is irradiated according to image-information to imagewise fuse the transferring layer 3 by heat energy converted from the laser light energy in the light-heat conversion layer 8. Then the image-forming element is separated from the transferring element as shown in FIG. 2c. Thus the image forming element 5 onto the color forming layer of which the fused portion of the transferring layer is transferred.

Next, the image-forming element is thermally treated in a manner similar to that in the first embodiment to mix Components 1 through 3 as shown in FIG. 2d. The image-forming element is further irradiated by light 10 having a wavelength capable of converting the photo-reducing agent to a reducing agent and is treated by heating. By this treatment, a reducing agent converted from the photo-reducing agent existing as Component 3 reacts with Component 1, as a result of the reaction, the cobalt(III) complex is reduced to a cobalt (II) complex and ammonia or primary amine ligand becomes easily released from the complex and ammonia or primary amine is released. The released ammonia or primary amine reacts to Component 2 and the absorption wavelength of Component 2 is shifted so as to form a visible image 7 as shown in FIG. 2d.

Figure 3:
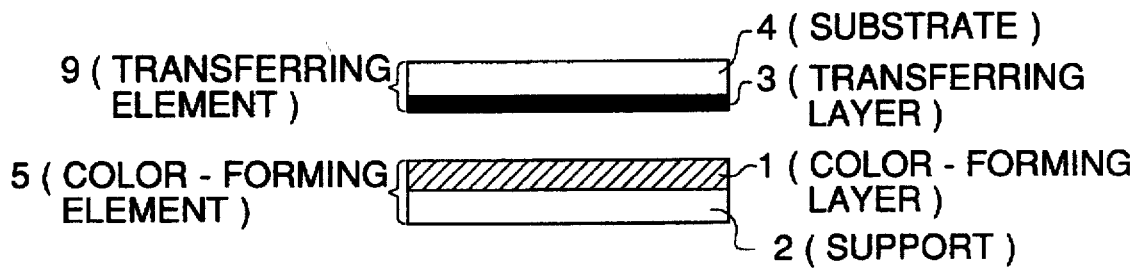
FIG. 3 shows an example of process of image formation of the invention
Figure 3:
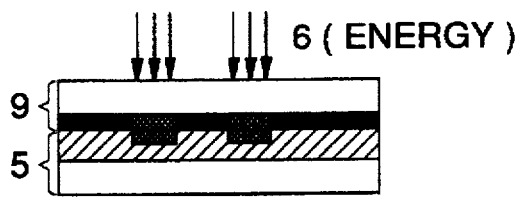
Figure 3:
Figure 3:
Figure 3:
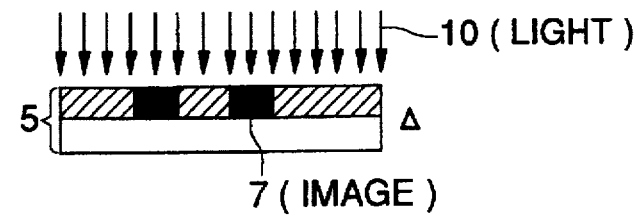

In FIG. 3a, an example of the case is shown in which a photo-reducing agent is contained in a transferring layer 3 as Component 3, and the component is solely transferred.

First, a color-forming layer 1 of an image-forming element is faced with a transferring layer 3 of a transferring element 9 as shown in FIG. 3b, and is heated according to image-information. Then the elements are separated from each other. Thus the image-forming element 5 having imagewise transferred Component 3 onto the color-forming layer thereof as shown in FIG. 3c.

Next, the image-forming element is thermally treated to mix Components 1 through 3 as shown in FIG. 3d. The image-forming element is further irradiated by light 10 having a wavelength capable of converting the photo-reducing agent to a reducing agent and is treated by heating. By this treatment, a reducing agent converted from the photo-reducing agent existing as Component 3 reacts with Component 1, as a result of the reaction, the cobalt(III) complex is reduced to a cobalt (II) complex and ammonia or primary amine ligand becomes easily released from the complex and ammonia or primary amine is released. The released ammonia or primary amine reacts to Component 2 and the absorption wavelength of Component 2 is shifted so as to form a visible image 7 as shown in FIG. 3e.

In the above description, a photo-reducing agent is used as a precursor of Component 3, i.e., a compound which makes ammonia or primary amine contained in the cobalt (III) complex as a ligand to be easily released from the complex. However, when a compound which makes ammonia or primary amine contained in the cobalt(III) complex as a ligand to be easily released from the complex is directly used, the image 7 can be formed only by the heat treatment shown in FIG. 3d.

As the means for applying energy according to image-information and the means for heating to be used in this embodiment, those described in the first embodiment can be optionally used.

3) Third Embodiment

In this embodiment an image is formed by the use of a transferring element having a transferring layer, an intermediate transferring medium comprising a substrate and an image-receiving layer provided on the substrate, and an image-forming element having a color-forming layer. The transferring layer contains one or two components selected from three kinds of components, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex, and the color-forming layer contains components/component other than the one or two of the three kinds of components contained in contained in the transferring layer. Although a case using the transferring element and the image-forming element shown in FIG. 4a is described below, the image formation also can be carried out as the same as shown in FIG. 4a when the component contained in the transferring layer is solely transferred to the image-forming element.

Figure 4:
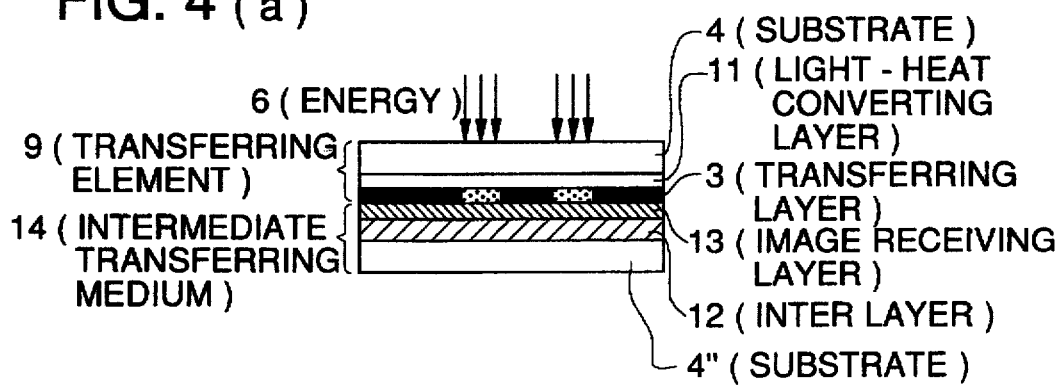
FIG. 4 shows an example of process of image formation of the invention
Figure 4:
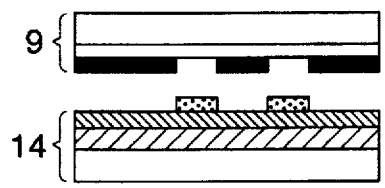
Figure 4:
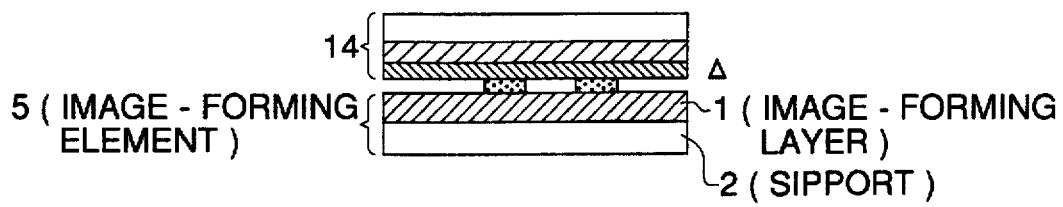
Figure 4:
Figure 4:
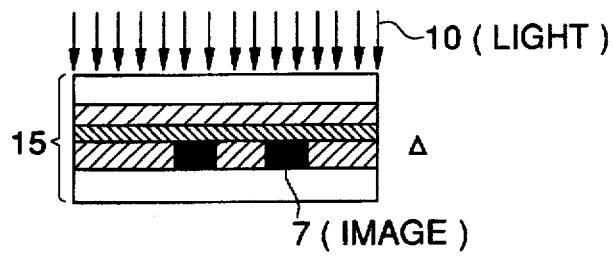

As is shown in FIG. 4a, a transferring layer of a transferring element 9 is faced with a image-receiving layer of an intermediate transferring medium 14 which comprises another substrate and an interlayer 16 and the image-receiving layer 13 provided on the substrate in this order, and is irradiated by laser light according to image-information to fuse imagewise the transferring layer by converting the laser energy to heat energy in a light-heat converting layer 11. After irradiation, the intermediate transferring layer is separated from the transferring element. Thus the intermediate medium 14 having the transferring layer imagewise transferred onto the image-receiving layer thereof is obtained as shown in FIG. 4b.

Next, as shown in FIG. 4c, the image-receiving layer 13 of the intermediate transferring medium 13 is faced with a color-forming layer 1 of an image-forming element 5 and is heated so as to mix the Components 1 through 3 and to unite both of the elements, at the same time, as shown in FIG. 4d. The united elements are further irradiated by light 10 having a wavelength capable of converting the photo-reducing agent to a reducing agent and is treated by heating. By this treatment, a reducing agent converted from the photo-reducing agent existing as Component 3 reacts with Component 1, as a result of the reaction, the cobalt(III) complex is reduced to a cobalt (II) complex and ammonia or primary amine ligand becomes easily released from the complex and ammonia or primary amine is released. The released ammonia or primary amine reacts to Component 2 and the absorption wavelength of Component 2 is shifted so as to form a visible image 7. In the case of FIG. 4a, a protective layer is provided on the color-forming layer of the image-forming element as a results of uniting with the image-forming element.

In the above description, a photo-reducing agent is used as a precursor of Component 3, i.e., a compound which makes ammonia or primary amine contained in the cobalt (III) complex as a ligand to be easily released from the complex. However, when a compound which makes ammonia or primary amine contained in the cobalt(III) complex as a ligand to be easily released from the complex is directly used, the image 7 can be formed only by the heat treatment shown in FIG. 4d. Although in the case of FIG. 4d, the intermediate transferring medium 14 and the image-forming element 5 is united, it is allowed that the elements are separated after the heat treatment of FIG. 4c, according to necessity, and the image-forming element 5 is only subjected to the light-exposure and the heat treatment in the after process.

Although in the case of FIG. 4a, two kinds of elements, i.e., the image-forming element 5 and the transferring element 14, the image-forming element 5 and the transferring element 14 may be united as in the first embodiment. Further, as is shown in FIG. 4b, the transferring layer is imagewise formed on both of the image-forming element 5 and the transferring element 14, the shapes of the transferring layers each formed on the image-forming element 5 and the transferring element 14 are in the relation of negative and positive. Therefore, an image may be formed by superimposing the transferring layer remained on the transferring element with another image-forming element 5, and heating them.

As the means for applying energy according to image-information and the heating means described in this embodiment, those used in the first and second embodiments can be optionally used.

4) Fourth Embodiment

In the first to third embodiments, an image is formed by applying phenomena such as thermal fusion, thermal diffusion and thermal polymerization by heating according to image-information. The image-forming method of this embodiment is based on the phenomenon of ablation. The phenomenon of ablation in the invention includes phenomenon of a layer is partially destroyed by formation of crack and that of a transferring layer is fused by heating so as to form a hole, i.e., fused substances of the transferring layer is diffused around the hole as swell as that of a layer is completely or partially disappear by thermal decomposition of the layer. The embodiment is described according to drawings below.

Figure 5:
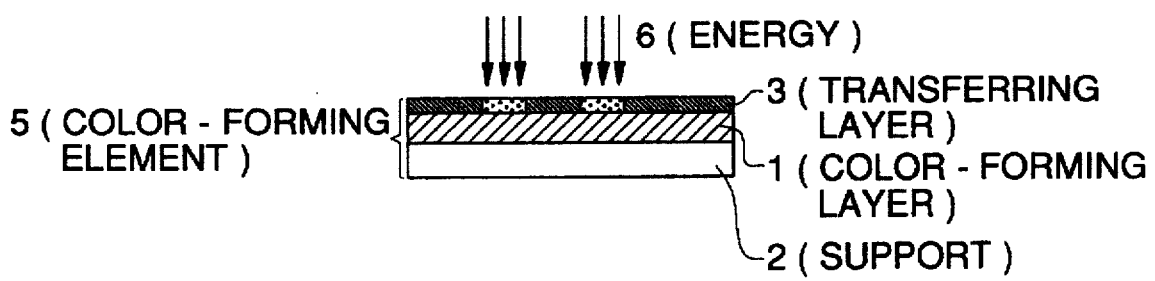
FIG. 5 shows an example of process of image formation of the invention
Figure 5:
Figure 5:
Figure 5:
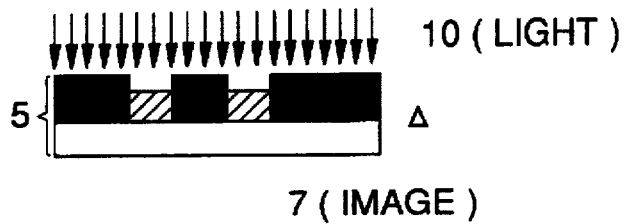

As is shown in FIG. 5a, an image is formed by using a image-forming element 5 which comprises a support 2, and a color-forming layer 1 and a transferring layer 3 provided on the support in this order. The color-forming layer 1 contains one or two components selected from three kinds of components, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex, and the transferring layer 3 contains components/component other than the one or two of the three kinds of components contained in contained in the color-forming layer.

FIG. 5a shows a case in which the transferring layer contains a light-heat converting substance and a photo-reducing agent as Component 3. In this case, the image-forming element 5 is irradiated by laser light according to image-information from the side of the transferring layer 3 so as to remove imagewise the transferring layer by ablation. Thus the image-forming element having the transferring layer which is partially removed at the portion irradiated by the laser light is obtained as shown in FIG. 5b.

Next, the image-forming element is subjected to heat treatment so that Components 1 through 3 are mixed as shown in FIG. 5c. The image-forming element is further irradiated by light 10 having a wavelength capable of converting the photo-reducing agent to a reducing agent and is treated by heating. By this treatment, a reducing agent converted from the photo-reducing agent existing as Component 3 reacts with Component 1, as a result of the reaction, the cobalt(III) complex is reduced to a cobalt(II) complex and ammonia or primary amine ligand becomes easily released from the complex and ammonia or primary amine is released. The released ammonia or primary amine reacts to Component 2 and the absorption wavelength of Component 2 is shifted so as to form a visible image 7 as shown in FIG. 5d.

In the above description, a photo-reducing agent is used as a precursor of Component 3, i.e., a compound which makes ammonia or primary amine contained in the cobalt (III) complex as a ligand to be easily released from the complex. However, when a compound which makes ammonia or primary amine contained in the cobalt(III) complex as a ligand to be easily released from the complex is directly used, the image 7 can be formed only by the heat treatment shown in FIG. 5d.

In this embodiment, a thermal head or electric current applying head may be used as the means for applying energy according to image-information. However, in the method using the ablation phenomenon by which the layer is completely or partially disappeared by heat decomposition, laser light is preferably used by which high energy can be applied within a short duration.

As the heating means to be used in the embodiment, those described in the first and Second Embodiments are optionally applicable.

5) Fifth embodiment

Figure 6:
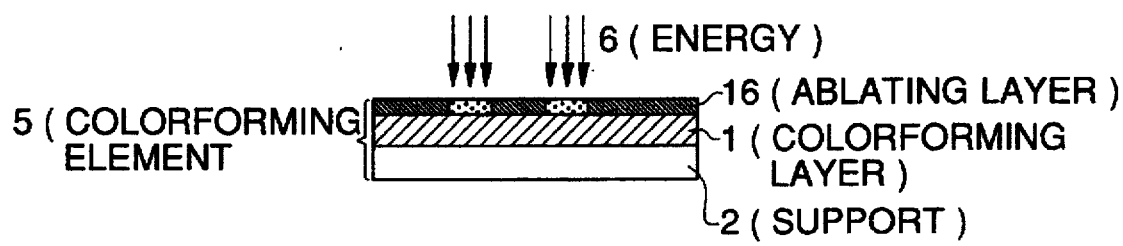
FIG. 6 shows an example of process of image formation of the invention
Figure 6:
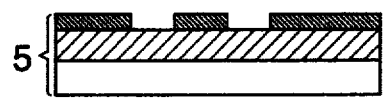
Figure 6:
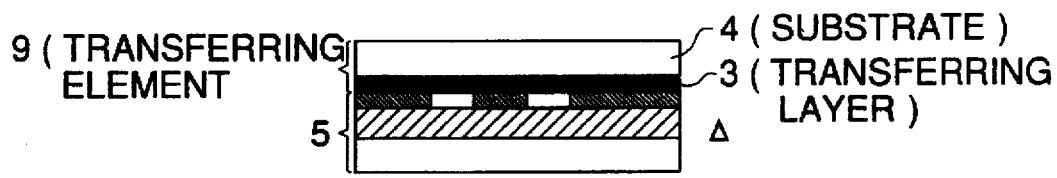
Figure 6:
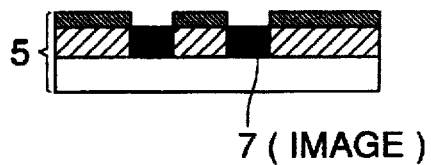

In this embodiment, the ablation phenomenon is applied the same as in the fourth embodiment. In the case of shown in FIG. 6a, an image-forming element is used, which comprises a support, and a color-forming layer 1 and ablating layer 16 containing a light-heat conversing substance piled in this order on the support. The color forming layer 1 contains one or two components selected from three kinds of components, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex. The image-forming element is irradiated by laser light according to image-information so that the ablating layer is removed by ablation by converting the laser light to heat energy. Thus the image-forming element, in which the irradiated portion of ablating layer is removed imagewise, is obtained as shown in FIG. 6b.

Then the ablating layer of the image-forming element is faced with a transferring layer 3 of a transferring element 9 and heated so that the components/component other than the one or two of the three kinds of components contained in the transferring layer is thermally diffused to the image-forming element through the ablated portion of the ablating layer. An image 7 is formed, as shown in FIG. 6c, by separating the image-forming element from the transferring element. In this case, the components contained in the color-forming layer are mixed with the components contained in the transferring layer when the components are thermally diffused into the color-forming layer of the image-forming element. As a result of that, Component 1 reacts with Component 3 and ammonia or primary amine being ligand is released, and the ammonia or primary amine released reacts with Component 2 so that the absorption wavelength in Component 2 is shifted. Thus the image 7 is formed.

Although in the above-described case, a image-forming element having a ablating layer on the color-forming layer thereof is used, the image formation is also possible by the use of a combination of a image-forming element having no ablating layer and a transferring element having a ablating layer. Further, in the above-described case, the components contained in the transferring layer are only thermally diffused. However, the whole composition of the transferring layer may be transferred when the adhesion force between the ablating layer 16 and the transferring layer 13 is weakened at the heating time and that between the color-forming layer 1 and the transferring layer is strong at the heating time.

The image-forming element may be further subjected to a heat treatment after separation from the transferring element for intensifying the density of the image.

As the means for applying energy according to image-information, laser light is preferred as well as in Fourth Embodiment. The heating means can be optionally selected from those described in First and Second Embodiments.

2. Materials to be Used in the Image-Forming Method

First, the essential components of the present invention, (1) a cobalt(III) complex having an ammonia ligand or a primary amine ligand, (2) a compound capable of being changed in the absorption wavelength thereof by ammonia or the primary amine, and (3) a compound or a precursor which makes ammonia or primary amine contained in the cobalt(III) complex as a ligand to be easily released from the complex, are described.

As cobalt(III) complex having ammonia or primary amine as a ligand, Component 1, any one of such complex capable of releasing ammonia or primary amine upon reaction with Component 3 mentioned later can be used without any limitation. Such the cobalt complex includes a neutral one having neither anion nor cation and one having one ore more cations or anions according to the charge neutralization law. However, a cobalt(III) complex compound represented by the following Formula 2 is preferably usable in the invention:

$[Co^{III}(Lig)_p]X^-_q$  Formula 2

In the formula, Lig is a coordination compound forming a complex with a cobalt ion and at least one of it is $NH_3$ or a primary amine. The primary amine is a coordination compound having at least one $NH_2$ group such as methylamine, ethylamine or butylamine. Particularly, di- or more-dentate coordination compound such as ethylenediamine, diethylenetriamine, triethylenetriamine, glycine amide or picoline amide, is preferable. p is an integer of 1 to 6, plural ligands represented by Lig may be the same or different when p is 2 to 6; $X^-$ is a counter anion; and q is an integer 1 to 3. As typical counter anions represented by $X^-$, benzilate, thiocyanate, acetate, perchlorate, hexafluorophosphate, nitrate, salicylate, chloride, fluoride, iodide, bromide and borate are described. A complex containing carboxyl anion is particularly preferred.

Concrete examples of cobalt complex usable in the invention are as follows: hexa-ammine cobalt(III) trifluroacetate, hexa-ammine cobalt(III) pentafluoropropionate, hexa-ammine cobalt(III)benzilate, hexa-ammine cobalt(III) thiocyanate, hexa-ammine cobalt(III) acetate, hexa-ammine cobalt(III) chloride, hexa-ammine cobalt(III) perchlorate, chloropenta-ammine cobalt(III) perchlorate, bromopenta-amminecobalt(III) perchlorate, aquapenta-ammine cobalt (III) nitrate, aquapenta-ammine cobalt(III) dichloroacetate, nitropenta-ammine cobalt(III) chloride, nitropenta-ammine cobalt(III) perchlorate, carbonatetetra-ammine cobalt(III) chloride, tris(ethylene-diamine) cobalt(III) perchlorate, bis (ethylenediamine)-bisazide cobalt(III) perchlorate, tris(1,3-propanediamine) cobalt(III) trifluoroacetate and tris-glycinamide cobalt(III) chloride.

The cobalt(III) complex represented by Formula 2 may be used singly or plurally in combination. The adding amount of the cobalt(III) complex is generally 0.1 to 30% by weight, preferably 2 to 20% by weight, based on the weight of the composition of the layer, even though the amount may be changed depending on the kind and using state of the complex.

Next, a compound capable of being changed in the absorption wavelength thereof by ammonia or the primary amine, Component 2, is described in detail. The compound capable of being changed in the absorption wavelength thereof by ammonia or the primary amine includes compounds capable of (a) changing from one having substantially no-color to one having a color, (b) changing from one having a color to one having no-color, and (c) changing from one having a color to one having different color, by reacting with ammonia and/or primary amine released from the cobalt(III) complex.

The above-mentioned compound of (a) is a compound which has substantially no absorption in the visible range of the spectrum and forms newly a absorption band in the visible spectral range when the compound is reacted with ammonia or primary amine. The compound of (b) is a compound originally having an absorption band within the visible spectral range and the absorption band is substantially disappeared when the compound is reacted with ammonia or primary amine. The compound of (c) is a compound originally having an absorption band in the visible spectral region, and the wavelength of the absorption band is shifted to shorter or longer wavelength side when the compound is reacted with ammonia or primary amine.

Among the compounds which are capable of changing in the absorption wavelength thereof, ones, of which absorption wavelength is shifted to longer wavelength, include aromatic dialdehydes such as o-phthalaldehyde and ninhydrin. On the other hand, noes, of which absorption wavelength is shifted to shorter wavelength, include a certain kinds of cyanine dye, styryl dye, rhodamine dye, azo dye and pyrylium dye. However, the compound of (a) or (b) is preferred from the view point of the contrast of formed image.

As typical compounds of (b), pyrylium dyes can be described, the concrete examples are followings: 2,6-diphenyl-4-(3-methoxyphenyl)pyrylium perchlorate, 4-phenyl-2,6-diethylpyriluun perchlorate, 4-(4-morpholinophenyl)-2,6-diphenylpyrylium perchlorate, 2,6-bis(p-methoxyphenyl)-4-phenylpyrylium tetrafluoroborate, 4-(4-dimethylaminovinyl)-2,6-diphenylpyrylium perchlorate, 2,6-diphenyl-4-[2-(10-methylphenothiazyl)] pyrylium perchlorate, 2-butyl-3-[β-(2-hydroxy-1-naphthyl) vinyl]-naphtho[2,1-b]pyrylium perchlorate, 4-(2-hydroxybenzylidene)-1,2,3,4-tetrahydroxyxanthilium perchlorate, 4-(4-methylmercaptophenyl)-2,6-diphenylpyrylium perchlorate, 9-phenyldibenzo[a•j]-xanthilium perchlorate, 2,6-diphenyl-4(4-methoxycarbonyl-phenyl)pyrylium perchlorate and 5,6-dihydro-2,4 diphenylnaphtho-[1,2-b]pyrylium tetrafluoroborate.

The adding amount of the above-mentioned pyrylium dye is preferably 0.1 to 10 moles, more preferably 0.5 to 6 moles, per mole of the cobalt(III) complex, even though the amount is changed depending on the kind of the ligand or stability constant of the cobalt(III) complex.

Besides, when a transparency black with a high density is required such the image as for a mask film for OHP of graphic arts, or a medical picture such as MIR or CT, it is preferred to select the compound of (a). As typical compounds of (a), aromatic dialdehydes are described. Concrete examples of the compounds of (a) are as follows:

(1)

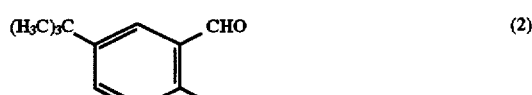
(2)

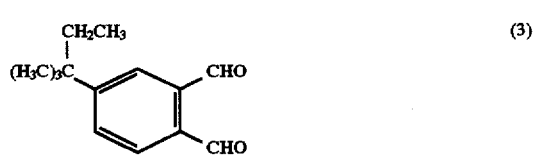
(3)

(4)

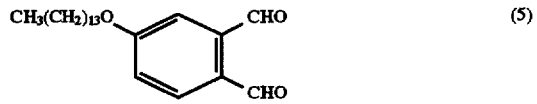
(5)

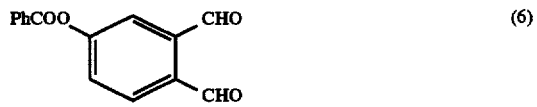
(6)

(7)

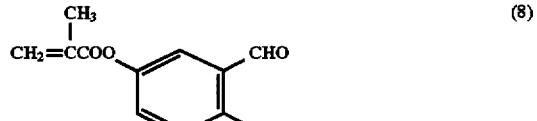
(8)

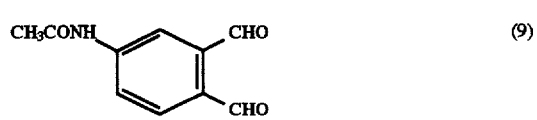
(9)

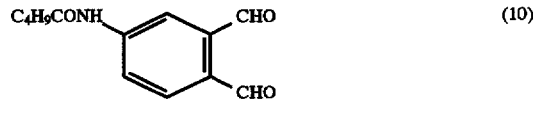
(10)

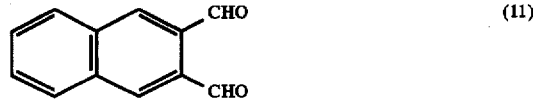
(11)

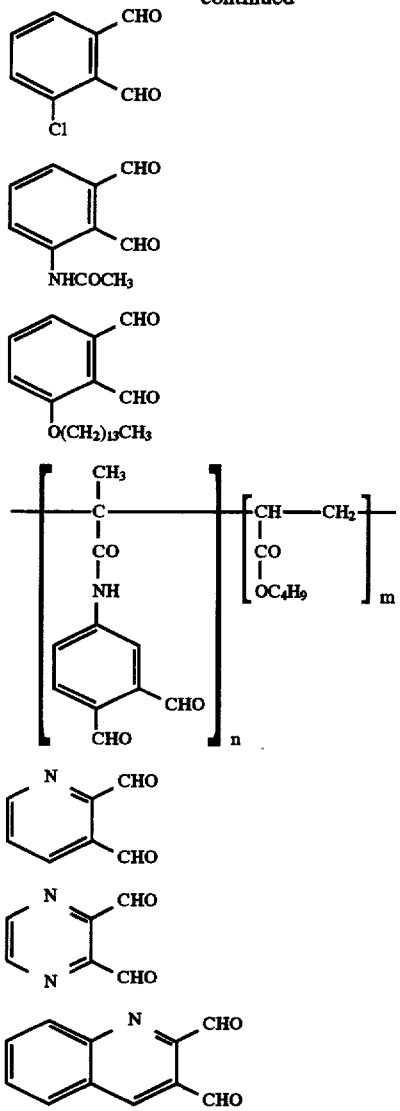

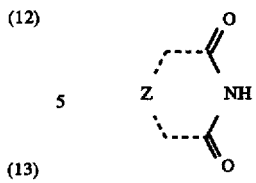

In Formula 1, Z is a group of atoms necessary to form a 5- to 7-member ring.

As the concrete examples of the above compounds the followings can be described; the reducing agents such as quinones, disulfides, diazoanthrones, diazophenanthrones, carbazides, diazosulfonates, diazonium salts, aromatic azides, benzimidazoles and aziridines; the radical-generating agents including azo compounds such as azobis-iso-butylonitryl; the peroxide compounds such as di-tert-butyl peroxide; the disulfide compounds such as tetraalkylthiuram disulfide; the organic metal compounds such as $AgC_2H_5$ and $Pb(C_2H_5)_4$; the organic metal complex such as manganese complex of acetylacetone; a combination of benzoyl peroxide with a combination of 4-valent cerium salt with polyvinyl alcohol; the antioxidants such as erythorbic acid, iso-propyl erythorbate, dibutylhydroxytoluene, butylhydroxy anisole, gallic ester and derivative thereof such as gallic acid, methyl gallate, double salt of methyl gallate and tetrabutylammonium in a ratio of 1:1; the compounds capable of being a ligand exchangeable to that of the cobalt(III) complex such as 2-amino-1,3-propylenediamine, diethylene-triamine, triethylenetetramine, tetraethylenepentaamine, 2,2'-dipyridine, 2,2',2"-terpyridine, 1,10-phenanthroline, dimrthylglyoxime and acetylacetone; and the guanidine derivatives such as 1,3-dimethyl-guanidine, 1,3-diphenylguanidine and 1,1,3,3-tetramethylguanidine. As the compounds represented by Formula 1 the followings are described: succinimide, phthalimid, 2-methylsuccinimide, dithiouracil, 5-methyl-5-n-pentylhydantoin, nitrophthalimide, 2,3,4,5-tetrachlorophthalimide, 5,5'-dimethyloxazolone, 5,5'dimethylhydantoin, 5-iso-propylhydantoin, 1-methylol-5,5'-diphenylhydantoin, 5,5'-diphenylhydantoin, melenimide, gultarimide, pyromellitimide, N-(trimethylsilyl)phthalimide, hydantoin, 3-methylphthlimide and 4-n-octylphthalimide.

Among the above, the compounds represented by Formula 1 are preferred from the viewpoint of the a blue-black tone image is obtained when the element is used for making a transparent image for medical use.

The adding amount of the above-mentioned aromatic aldehyde cannot be indiscriminately decided since the amount is changed depending on the kind of ligand or the stability constant of the complex. However, the preferable amount is usually 1 to 20 moles, more preferably 3 to 10 moles, per mole of the cobalt(III) complex.

The compound or a precursor thereof which makes ammonia or primary amine contained in the cobalt(III) complex as a ligand to be easily released from the complex, Component 3, can be classified, according to the process of accelerating the releasing of the ligand, as follows: (a) one which makes ligand of the cobalt(III) complex to be easily released from the complex by reducing the cobalt(III) complex to a cobalt(II) complex, (b) one having a ligand with higher stability constant than the ligand of the cobalt(III) complex and accelerates releasing of the ligand from the complex by ligand exchange, (c) one which accelerates releasing the ligand by introducing distortion into the octagonal structure of the cobalt(III) complex. A such the compound, a reducing agent including a photo-reducing agent, a radical-generating agent including a photo-radical-generation agent, an antioxidant, a chelate-exchanging agent, a guanidine derivative, and a compound represented by the following Formula 1:

The adding amount of the above-mentioned compound or a precursor which makes ammonia or primary amine contained in the cobalt(III) complex as a ligand to be easily released from the complex cannot be indiscriminately decided since the amount is changed depending on the kind of ligand or the stability constant of the complex. However, the preferable amount is generally 0.01 to 20 moles, more preferably 0.1 to 10 moles, per mole of the cobalt(III) complex.

Next, elements containing the essential Components 1 through 3, I.e., the image-forming element, transferring element, and intermediate transferring medium and protective layer which are used according to necessity, are described below.

1) Image-Forming Element

The image-forming element to be used in the image-forming method of the invention is roughly classified to the following two kinds according to the presence of the essential components and the added portion thereof: a) one composed of a support, a color-forming layer containing on or two components selected from Components 1 through 3 and a transferring layer containing components/component other than the one or two of the three kinds of components contained in the color-forming layer provided on the support in this order, and b) one composed of a support, and a color-forming layer containing on or two components selected from Components 1 through 3 provided on the support.

The support usable in the image forming element includes paper, synthetic paper such as a synthetic paper mainly composed of polypropylene or that having porous pigment coating layers on both surface thereof, a plastic film made by a resin such as polyacrylate, polymethacrylate, polyethylene terephthalate, polybutylene terephthalate, polyethylene naphthalate, polycarbonate, polyallylate, polyvinyl chloride, polyethylene, polypropylene, polystyrene, nylon, aromatic polyamide, polyetheretherketone, polysulfon, polyethersulfon, polyimide or polyetherimide, a film prepared by laminating two or more kinds of the above-mentioned films, or a film prepared by laminating a layer of the above-mentioned resin on a paper made from wood pulp, cellulose pulp or sulfite pulp.

Among them, a resin film prepared by heat setting after stretching in a form of film is preferred form the viewpoint of dimension stability since the element is frequently subjected to heat treatment in the image-forming method of the invention. A support having a transparency of 70% or more is preferred when the element is applied for use in which a transparency is required, for example, for mask film for OHP and graphic arts, for film for making a transparent image for medical use and for a seal to be adhered on glass. To these supports, various kinds of pigment, dye, tone controlling agent, and fluorescent whitening agent may be added. In the case of a element for forming a reflective image, it is preferred to add a white pigment such as titanium white, magnesium carbonate, zinc oxide, barium sulfate, silica, talc, clay, calcium or carbonate to raise the celerity of the formed image.

The thickness of the support is generally 20 to 500 μm, preferably 50 to 120 μm.

It is preferred in the image-forming element of the invention to add a binder resin to the color-forming layer or transferring layer for holding the above-mentioned essential components. As such the binder resin, the following resins are usable: a polyolefin resin such as copolymer of ethylene and vinyl acetate; a vinyl chloride resin such as polyvinyl chloride or copolymer of vinyl chloride and vinyl acetate; an acryl resin such as polyacryl resin or polymethacryl resin; a styrene resin such as polystyrene or copolymer of styrene and acrylonitril; polycarbonate; polysulfon; polyethersulfon; phenoxy resin; a polyvinyl acetal resin such as polyvinyl butyral or polyvinyl acetoacetal; an organic solvent-soluble polymer such as nitro cellulose or ethyl cellulose and a water-soluble polymer such as gelatin, polyvinyl pyrrolidone, polyvinyl alcohol, hydroxypropyl or cellulose. These binders can be used in a dispersed form of latex as well as in the form of solution dissolved in various kinds of solvent solely or plurally. It is preferred to use the binder resin in an amount of 10 to 99% by weight, more preferably 20 to 80% by weight, based on the weight of the composition of the layer, even though the amount may be changed depending on that the element has single layer structure of double layer structure according to the use of the element.

Next, the image-forming element is described according to the element used in the above-mentioned image-forming method as an example. The image-forming element shown in FIG. 1a is composed of a color-forming layer containing a binder resin and one or two of Components 1 through 3 and a thermally polymerizable transferring layer containing components/component other than the one or two of the three kinds of components contained in contained in the color-forming layer and a light-heat converting substance, and a substrate, which are laminated on a support in this order. In the above structure, it is preferred that Component 3, which is effective even when the removed amount of it is a little, is contained in the polymerizable transferring layer and the other Components 1 and 2 are contained in the color-forming layer, since a high density of image can be obtained by exposing to relatively small energy according to image-information.

The color-forming layer is heat-sensitive and comprises a binder resin and one or two of Components 1 through 3 dispersed in the binder. In the heat-sensitive color-forming layer, another additive such as a peering agent, UV absorbent, stabilizer against light, filler such as inorganic or organic particles, pigment or anti-static agent may be added as long as the object of the invention is not disturbed. A plasticizer or heat-solvent also may be added as a sensitizer.

A peeling agent may be contained in the color-forming layer for donating a peeling ability to the layer. As the peeling agent, a silicone oil, a silicone resin; a solid wax such as polyethylene wax, amide wax, Teflon powder, a fluorine-containing surfactant and phosphate-containing surfactant; and a polyolefin resin such as polyethylene resin and polypropylene resin are exemplified.

As the UV absorbent and stabilizer against light, compounds described in JP O.P.I. Nos. 59-158287/1984, 63-74686/1988, 63-145089/1988, 59-196292/1984, 62-229594/1987, 63-122596/1988, 61-283595/1986, 1-204788/1989 and resin particle and compounds described in "11290 commercial chemicals", p.p. 869–875, Kagaku-kogyo Noppo-sha, can be described.

As the filler, a inorganic filler such as carbon black, graphite, $TiO_2$, $BaSo_4$, ZnS, $MgCO_3$, $CaCO_3$, ZnO, CaO, $WS_2$, $MoS_2$, MgO, $SnO_2$, $Cr_2O_3$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, silex, diatomaceous earth or dolomite; and an organic filler such as polyethylene resin particle, fluorine resin particle, guanamine resin particle, acryl resin particle, silicone resin particle or melamine resin particle can be described.

As the pigment, titanium white, calcium carbonate, zinc oxide, barium sulfate, silica, talc, clay, kaolin, active terra alba and acidic terra alba can be described.

As the anti-static agent, a cationic surfactant, anionic surfactant, nonionic surfactant, macromolecule anti-static agent, conductive fine particle and compounds described in "11290 commercial chemicals", p.p. 875–876, Kagaku-kogyo Nippo-sha, can be described. As the plasticizer, phthalic acid ester, trimellitic acid esters, adipic acid esters, esters of saturated or unsaturated carbonic acid, citric acid esters, epoxy compounds such as epoxized soybean oil and expoxized linseed oil, orthophosphoric acid esters, glycol esters and compounds described in "11290 commercial chemicals", p.p. 843–857, Kagaku-kogyo Nippo-sha, are suitably used.

As the thermally fusible substance, amides such as benzamide, eaters such as cumarin, ethers such as diphenylether, ketones such as p-methylacetophenone, carbons hydrides such as stilbene, higher fatty acids such as margaric acid, higher alcohol such as eicosanol, higher fatty esters such as cetyl palmitate, waxes such as carnauba wax, beeswax, montan wax, amide wax, rosin derivatives such as ester gum, rosin-maleic resin and rosin-phenol resin, phenol resins, diacryl phthalate resins, terpene resin, aliphatic carbon hydride resins, cycropentadiene resins, and polyolefinoxides such as polyethylene glycols can be described. In the invention, a thermal fusible substance having a melting point or softening point of 10° to 150° C. is preferred.

It is preferred that the adding amount of the above-mentioned additives is made to be within the range of 0.1 to 30% by weight in total based on the amount of the binder resin.

The color-forming layer composed of the above-mentioned composition may have a single-layer structure or plural-layer structure, and the thickness of the color-forming layer is generally 3 to 20 μm and is preferably 5 to 15 μm.

The polymerizable transferring layer contains a light-heat converting agent, a polymerizable compound and a polymerization initiator. As the light-heat converting agent any substance can be used without any limitation as long as the substance can efficiently absorb laser light irradiated in accordance with image-information and convert the light to heat. A substance having a absorption band within the infrared region is preferably used when a laser is used as the light source. In concrete, one optionally selected from the followings is usable: carbon black, graphite, magnetic powder such as metal powder and magnetite powder, phthalocyanine dyes, squalium dyes, croconium dyes, azulenium dyes, nitroso compound and metal complex thereof, cyanine dyes, merocyanine dyes, polymethine dyes, dithiol metal complex dyes, triarylmethane dyes, indoaniline dyes, naphthoquinone dyes and anthraquinone dyes.

As the polymerizable compound, compounds each having a ethylenic unsaturated bond or an epoxy group are usable. Among them, the compounds having ethylenic unsaturated bond are preferred from the viewpoint of polymerization speed. As the ethylenic unsaturated compound, known monomers capable of polymerizing by additional polymerization or cross-linking polymerization without any specific limitation. In concrete, the following monomers are preferably usable: mono-functional acrylates and derivatives thereof such as 2-ethyl-hexyl acrylate, 2-hydroxyethyl acrylate and 2-hydroxypropyl acrylate, and compounds derived from the above compounds by replacing the acrylate with methacrylate, itaconate, crotonate or maleate; di-functional acrylates and derivatives thereof such as polyethylene glycol diacrylate, pentaerythritol diacrylate, bisphenol A diacrylate, diacrylate of ε-caprolactone adduct of hydroxypivalic acid neopentyl glycol, and compounds derived from the above compounds by replacing the acrylate with methacrylate, itaconate, crotonate or maleate; multi-functional acrylate and derivative thereof such as trimethylpropane tri(metha)acrylate, dipentaerythritol pentaacrylate, dipentaerithritol hexaacrylate and pyrogallol triacrylate, and compounds derived from the above compounds by replacing the acrylate with methacrylate, itaconate, crotonate or maleate; prepolymers each formed by introducing acrylic acid or methacrylic acid to a oligomer having an appropriate molecular weight which called as prepolymer. Other than the above, compounds described in "1129 commercial chemicals" p.p. 286–294, Kagaku-kogyo Nippo-sha, or "UV, BE Curing Hand Book" p.p. 11–65, Kobunshi Kanko-kai, are also preferably usable. Among the above monomers, ones each having two or more acryl or methacryl groups in the molecule are preferred. Further, ones having a molecular weight of not more than 10,000, particularly not more than 5,000, are preferred. The monomer or prepolymer may be used singly or plurally in combination.

For the polymerization initiator, a thermal polymerization initiator or a photo-polymerization initiator can be optionally selected. The thermal polymerization initiator is classified to a single-component initiator and two-component initiator or redox initiator. The single-component initiator includes azo compounds such as azobis-iso-butylonitryl and azodibenzoyl; peroxide compounds such as peroxit-butyl peroxide and benzoyl peroxide; disulfide compounds such as tetraalkylthiuram disulfide; organic metal compound such as $AgC_2H_5$ and $Pb(C_2H_5)_4$; and organic metal complexes such as manganese complex of acetylacetone and pentacyanobenzyl cobaltate. The redox initiator includes combination of benzoyl peroxide and dimethylaniline, and that of a fourvalent cerium salt and polyvinyl alcohol.

As the photo-polymerization initiator, benzoin compounds such as benzoin and benzo-iso-methyl ether; carbonyl compounds such as benzophenone and Micheler's ketone; azo compounds such as azobis-iso-butylonitryl and azobenzoyl; sulfides such as dibenzothiazolyl sulfide and tetraethyl-thiuram sulfide; halogenized compound such as carbon tetrachloride and tribromophenylsulfon; peroxide compounds such as di-tert-butyl peroxide and benzoyl peroxide; metal carbonyl compounds; metal complexes such as iron allane complex and complex thione dye and borate anion described in European Patent Nos. 126,712 and 152,377; are described.

The polymerizable compound is preferably used in an amount of generally 10 to 90% by weight, preferably 20 to 80% by weight, based on the weight of the composition forming the layer, and the light-heat converting agent is preferably added in a ratio of 0.1 to 100 parts by weight, more preferably 0.5 to 50 parts by weight per 100 parts by weight of the polymerizable compound.

It is preferred to add a binder resin to the above-mentioned layer containing the light-heat converting agent, the polymerizable compound and the polymerization initiator. A such the binder, polyester resins, polyvinyl acetal resins, urethane resins, polyamide resins, cellulose resins, olefin resins, vinyl chloride resins, (metha)acrylate resins, styrene resins, polycarbonate, polyvinyl alcohol, polyvinyl pyrrolidone, polysulfon, polycaprolactone resin, polyacrylonitryl resin, urea resin, epoxy resin, phenox resin, and rubbers are described. Further, a resin having an unsaturated bond in its molecular such as diallyl phthalate resin or its derivatives, or cholorinated polypropylene; or a resin having an epoxy group in the molecule thereof such as glycyl-modified vinyl chloride resin may be appropriately used together with the above-mentioned polymerizable compound according to the use since such resins can be polymerized with the polymerizable compound. The above-mentioned binder resins may be used either singly or in combination of two or more.

The binder resin is preferably used and mixed with the other composition of the layer in an amount of 10 to 90 parts by weight, more preferably 20 to 80 parts by weight, per 100 parts by weight of the layer forming composition.

In the layer, another additive other than the light-heat converting agent, polymerizable compound, polymerization initiator and binder resin, may be added as long as the object of the invention is not disturbed. As such the additive, one selected from those described as additive for the color-forming layer. The amount of the additives is preferably set within the range of 0.1 to 50% by weight of the total weight of the layer forming composition.

The thickness of the layer containing the light-heat converting agent, polymerizable compound, polymerization initiator is appropriately decided according to the object, within the range of generally 0.05 to 20 μm, preferably 0.5 to 10 μm.

The substrate laminated on the polymerizable transferring layer optionally selected from those to be used for the image-forming element. The thickness of the substrate is preferably made thinner than that of the support of the image-forming element. It is preferred that the surface of the substrate to be contacted to the polymerizable transferring layer is treated for improving the adhesivness with the polymerizable transferring layer such as corona discharge treatment.

Further, an interlayer may be provided between the support and the color-forming layer for giving an adhesivness, heat insulation ability and cushion property. When the interlayer is provided, the thickness of the interlayer is generally 0.01 to 10 µm, preferably 0.05 to 5 µm. The interlayer may be either provided as a single layer or as laminated plural sublayers. The composition of the sublayers may be the same or different for allotting the functions of the interlayer to each the sublayer according to the necessity.

A backing layer may be provided on the surface of the support of the image-forming element opposite to the surface on which the color-forming layer for the purposes of static charge prevention, double feeding prevention, lubricity donation, prevention of adhesion with another image-forming element and curing prevention. For the purpose of static charge prevention, double feeding prevention, lubricity donation, prevention of adhesion with another image-forming element, the anti-static agent and/or filler or pigment described in the description of the additive for color-forming layer are preferably added to the backing layer. For prevention of curling, a resin having a high thermal resistivity which is difficult to be thermally deformed, or a resin which can be cured after formation of the backing layer by heating or irradiation by ionized radiation is preferably used.

When the backing layer is provided, it is preferred that the thickness of the backing layer is made to 0.01 to 10 µm, generally. The backing layer may be either provided as a single layer or as laminated plural sublayers. The composition of the sublayers may be the same or different for allotting the functions of the interlayer to each the sublayer according to the necessity.

The image-forming element is prepared by a coating method in which coating solutions for each of the layers of image-forming element are prepared by dissolving or dispersing the various ingredients for each coating solution in a solvent and coating the coating solutions on the surface of a support on which the laminated layers to be provided, to form laminated layers and drying them or by a transferring method in which each of the layers are formed on a peelable sheet and the layer is only transferred on the surface of the support on which the laminated layer to be provided, by heating and/or applying pressure.

As the solvent to be used for preparing the coating solution, water, alcohols such as ethanol and propanol, cellusolves such as methyl cellusolve and ethyl cellusolve, aromatic solvents such as toluene, xylene and chlorobenzene, ketones such as acetone and methyl ethyl ketone esters such as ethyl acetate and butyl acetate, ethers such as tetrahydrofulan, dioxane, halogen-containing solvents such as chloroform and dichlorobenzene, and amide solvents such as dimethylformamide and N-methylpyrrolidone, may be used.

For kneading and dispersing of a coating liquid of layer containing a silver source or preparing a coating liquid containing a dispersion of oil-protected composition, various dispersion or kneading means may be used such as a double-roll mill, triple-roll mill, ball mill, pebble mill, co-ball mill, sand mill, sand grinder, Sqevari-attritor, high-speed impeller disperser, high-speed stone mill, high-speed impact mill, disper, high-speed mixer, homogenizer, ultra-sonic disperser, open kneader or continuous kneader.

The color-forming layer can be formed by coating and dying by means of, for example, an extrusion coating method, gravure roll coating method, wire-bar coating method or roller coating method. The surface of the coated layer may be subjected to a calendering treatment to raise the smoothness of the surface.

When a layer other than the color-forming layer is further provided, these layers may either be separately coated and dried from each other or simultaneously coated and dried by wet-on-wet method. For coating the layers wet-on-wet, a combination of reverse roll coater, gravure roll coater, air-doctor coater, squeeze coater, immersion coater, bar coater, transfer coater, kiss coater, cast coater, press coater and extruding coater may be used. The wet-on-wet coating is preferred, by this method, the adhesiveness between the upper and lower layers is strengthen since the upper layer is provided on the lower layer in a wetted state.

A image-forming element shown in FIG. 1a is preferably prepared by sticking an element composed of the color-forming layer provided on the support and an element composed of a polymerizable transferring layer on another substrate for easily peeling off the polymerizable transferring layer from the color-forming layer. A pressure applying means for sticking these layers, those described in the image-forming method can be optionally used. The sticking may be carried out by applying heat and pressure in combination.

The image-forming elements shown in FIGS. 2a, 3a and 4c are each composed of a color-forming layer containing one or two components selected from Components 1 through 3 provided on a support. For the image-forming layer of the above elements, the support and the color-forming layer described with respect to the element of FIG. 1a can be optionally used. In such the case, it is preferred, similar to the case of FIG. 1a, to contain Component 3 in the transferring layer later described and to contain Components 1 and 2 in the color-forming layer. By such the constitution, a high image density can be obtained by a relatively low energy when applying to energy according to image-information since Component 3 is effective for image formation by moving of a small amount thereof. Further, an interlayer may be provided between the support and the color-forming layer for giving an adhesiveness, heat insulation ability and cushion property. A backing layer may be provided on the surface of the support of the image-forming element opposite to the surface on which the color-forming layer, for the purposes of static charge prevention, double feeding prevention, lubricity donation, prevention of adhesion with another image-forming element and curing prevention. As the constitution and thickness of theses layers, those describes as to the image-forming element of FIG. 1a may be optionally used.

The image-forming element shown in FIG. 5a is composed of a support and a color-forming layer containing one or two component selected from Component 1 through 3 and a ablating layer containing the components/component other than one or two component selected from Component 1 through 3 contained in the color-forming layer laminated on the support in this order. As the support and the color-forming layer, those described as t the element of FIG. 2a can be optionally used. In this case, it is preferred, similar to the case of FIG. 1a, to contain Component 3 in the transferring layer later described and to contain Components 1 and 2 in the color-forming layer. By such the constitution, a high image density can be obtained by a relatively low energy, when applying to energy according to image-information since Component 3 is effective for image formation by moving of a small amount thereof. Further, an interlayer may be provided between the support and the color-forming layer for enhancing an adhesiveness, heat insulation ability and cushion property. A backing layer may be provided on the surface of the support of the image-forming element opposite to the surface on which the color-forming layer, for the purposes of static charge prevention, double feeding prevention, lubricity donation, prevention of adhesion with another image-forming element and curing prevention. As the constitution and thickness of theses layers, those describes as to the image-forming element of FIG. 2a may be optionally used. Here, the ablating layer is described in detail which contains components/component other than on or two selected from Components 1 through 3 contained in the color-forming layer.

Although there is no specific limitation on the ablating layer as long as the layer is ablatable, it is preferred that to constituted so as to have a high strengthen when the layer is completely or partially disappear by heat decomposition. For this purpose, it is preferred that the ablating layer contains a water-soluble resin, a resin having a ionic bond, or a resin having a glass transition point Tg of not less than 80° C., more preferably not more than 100° C. as a main composition. Concrete examples of the water-soluble resin include gelatin, casein, polyvinyl alcohol, water-soluble polyvinyl formal, water-soluble polyvinyl acetal, water-soluble polyvinyl butyral, polyvinyl pyrrolidone, water-soluble polyester, water-soluble nylon, polyacrylic acid, water-soluble polyurethane, methyl cellulose and hydroxypropyl cellulose. As the ionic bond-containing resin, an ionomer resin or a resin containing sulfo-substituted styrene, acrylic acid, methacrylic acid or phthalic anhydride as a copolymer composition with a counter ion such as $Na^+$, $K^+$, $Ca^{2+}$, $Zn^{2+}$ or $NH_4^+$ can be described. As the resin having a Tg point not less than 80° C., pollvinyl chloride, polystyrene, polymethyl methacrylate, polybenzyl methacrylate, polycarbonate, nylon, polyphenyleneoxide, gelatin and polyparabanic acid can be described. A copolymer of monomers such as styrene, vinyl chloride, methyl methacrylate, aryl methacrylate, acrylonitril, ethyleneoxide, benzyl methacrylate and cyclohexyl methacrylate, which has a Tg of not less than 80° C., may also be used preferably. Further, a thermally curable resin and photo-curable resin, which are preferable, which have no glass transition point.

The content of the resin in the ablating layer is generally not less than 50% by weight, preferably not less than 70% by weight, based on the total weight of the ablating layer.

The ablating layer further contains a light-heat converting agent. As the light-heat converting agent, those described as to the image-forming element shown in FIG. 1a can be optionally used. Further, another additive that to be added to the color-forming layer of the element of FIG. 1a is optionally added to the ablating layer as long as the additive does not disturb the ablating property of the layer.

It is preferred that the thickness of the ablating layer is as thinner as possible, as long as the functions of the above-mentioned compositions of the ablating layer is not disturbed. In concrete, the thickness of the layer is within the range of 0.1 to 2.0 μm, preferably 0.1 to 1.0 μm. However, the thickness of the layer is not limited to the above-mentioned value since the layer having a larger thickness can be ablated when the intensity energy for ablation is sufficiently high. The ablating layer may be constituted by plural sublayers sharing the functions of the ablating layer. As the shared functions of the layer, high density image formation, electric conductivity, light-absorbency and anti-blocking property are described. These functions may be taken separately by each of the sublayers different from each other.

The above-mentioned image-forming element can be prepared in a manner similar to that for the element of FIG. 1a.

The image-forming element shown in FIG. 6a is composed of a support and a color-forming layer containing one or two kinds of components selected from Component 1 through 3 and an ablating layer laminated on the support in this order. Such the element can be constituted by omitting the components/component other than one or two components selected from Components 1 through 3 from the ablating layer of the element shown in FIG. 5a. Further, it is preferred also in this image-forming element, to contain Component 3 in the transferring layer later described and to contain Components 1 and 2 in the color-forming layer. By such the constitution, a high image density can be obtained by a relatively low energy when applying to energy according to image-information since Component 3 is effective for image formation by moving of a small amount thereof.

The above-mentioned image-forming element can be prepared in a manner similar to that for the element of FIG. 1a.

2) Transferring Element

Principal methods for supplying one of two components selected from Component 1 through 3 from a transferring layer provided on a substrate of a transferring element to the color-forming layer, include two method, i.e., a) heat fusing transfer method in which the above components are transferred together with a thermally fusible binder of the transferring layer, and b) thermal diffuse transfer method in which the thermally diffusible component/components are contained in the thermally softenable binder and the component/components are only diffused by heating. Transferring elements suitable the above methods are described below.

As the substrate for the transferring element, one similar to that usable for the support of the image-forming element is optionally be used for fitting with the transferring method. It is preferred that the thickness of the substrate is to be thinner than the support of the image-forming element. When a thermal head is used as the means for applying energy according to image-information, the thickness of the substrate is generally 2 to 10 μm, preferably 4.5 to 7 μm, for conducting heat with a efficiency.

The transferring element is described below according to the element used in the above-mentioned transferring method.

The transferring element shown in FIG. 2a is composed of a substrate and a light-heat converting layer and a transferring layer containing the components/component other than one or two components selected from Components 1 through 3 contained the color-forming layer of the image-forming element, provided on the substrate. The element is characterized in that the transferring layer is composed of a composition which can be transferred by heat. It is preferred to contained Component 3 in the transferring layer since Component 3 is effective for image formation by moving of a small amount thereof, as above-described with respect to the image-forming element. The light-heat converting layer may be omitted when an thermal head is used as the means for applying energy according to image-information.

The transferring layer contains a binder additionally to the essential component/components. As the binder, thermally fusible substances or thermoplastic resins are usable, which are used in known thermal transfer elements.

Concrete example of the thermally fusible substance include vegetable waxes such as carnauba wax, wood wax; animal waxes such as bee wax, insect wax, shellac wax and whale wax; petroleum waxes such as paraffin wax, microcrystal wax, polyethylene wax, ester wax, acid wax; and mineral waxes such as montan wax and ceresine. Usable thermally diffusible substance further includes higher fatty acids such as palmitic acid, stearic acid, margaric acid and behenic acid; higher alcohols such as palmityl alcohol, stearyl alcohol, behenyl alcohol, margaryl alcohol, myricyl alcohol and eicosanol; higher fatty acid eater such as cetyl palmitate, myricyl palmirate, cetyl stearate and myricyl stearate; amides such as acetoamide, propionamide, palmitamide, stearamide and amide wax; and higher amine such as stearylamine, behenylamine and palmitylamine. As the thermoplastic resin, resins such as ethylene copolymers, polyamide resins, polyester resins, polyurethane resins, polyolefin resins, acryl resins, vinyl chloride resins, cellulose resins, rosin resins, polyvinyl alcohol resins, polyvinyl acetal resins, ionomer resins and petroleum resins; elastomers such as natural gum, styrenebutadiene gum, isoprene gum, chloroprene gum and dien-compound copolymer; rosin derivatives such as eater gum, rosin-maleic resin, rosin-phenol resin and hydrogenated rosin; and macromolecular compound such as phenol resin, terpene resin, cyclopentadiene resin and aromatic hydrocarbon resins.

A colorant may be added to the transferring layer for compensating the density or tone of the image. As the colorant, for example, inorganic or organic pigments and dyes usually used in a thermal fusion transfer element. Another additive to be added to the color-forming layer of the element shown in FIG. 1a may be added to each of the layer as long as disturbing the purpose of transferring.

The thickness of the transferring layer is generally 0.2 to 2.0 µm, preferably 0.3 to 1.5 µm.

The light-heat converting layer can be constituted by a light-heat converting substance and a binder. The light-heat converting substance can be optionally selected from those described with respect to the element of FIG. 1a. As binder resin, one having a high heat resistivity and high heat conductivity is referred. In concrete, polymethyl methacrylate, polycarbonate, polystyrene, methyl cellulose, ethyl cellulose, nitrocellulose, polyvinyl alcohol, polyvinyl chloride, polyamide, polyimide, polyetherimide, polysulfon, polyethersulfon, aramide and gelatin are described.

Among them, a water-soluble resin is preferably selected when a transferring layer composed of an organic solvent-soluble resin, for obtaining a good peeling ability from the transferring layer. The thickness of light-heat converting layer is generally 0.1 to 3 µm, preferably 0.2 to 1.0 µm.

Further, the light-heat converting layer can be formed by evaporated layer. As the evaporated layer, that of carbon black, and metal black evaporated layer of gold, silver, aluminum, chromium, nickel, antimony, tellurium, bismuth and selenium described in JP O.P.I. 52-20842/1977 can be cited.

To the transferring element, further to the substrate, light-heat converting layer and the transferring layer, an inter layer may be provided between the substrate and the light-heat converting layer for donating a adhesiveness, heat insulating property and cushion property. A backing layer may be further provided on the surface of the substrate of the transferring element opposite to the surface on which the transferring layer is provided, for the purposes of static charge prevention, double feeding prevention, lubricity donation and curling prevention. The thickness and constitution of the interlayer or backing layer described with respect to the image-forming are optionally applied to the above-mentioned layers.

The above-mentioned transferring element can be prepared in a manner similar to that in the element shown in FIG. 1a.

The transferring elements shown in FIGS. 3a and 6c are ones composed of a substrate and a transferring layer containing a light-heat converting substance and the components/component other than one or two of the three kinds of Component 1 through 3 contained in the color-forming layer provided on the substrate. The layer is characterized in that the layer constituted so that the components/component other than one or two of the three kinds of Component 1 through 3 contained in the color-forming layer are only transferred by heating. It is preferred to contained Component 3 in the transferring layer since Component 3 is effective for image formation by moving of a small amount thereof. The transferring element can be prepared basically in the same constitution as in the transferring element of FIG. 2a.

As the binder for the transferring layer, one hardly adhered by heating with the image-forming element or the later described intermediate transferring medium is preferred. As such the binder, acetal resins such as polyvinyl butyral, polyvinyl acetoacetal and polyvinyl formal; cellulose resins such as ethyl cellulose and nitro cellulose; vinyl chloride resins, acryl resins, urethane resins, polyester resins, polyolefin resins, ethylene vinyl acetate resins, ethylene acrylate resins, styrene resins, epoxy resins and phenoxy resins are usable. The releasing agent to be added to the color-forming layer of the element of FIG. 1a may preferably added to this layer when the effect of the binder is insufficient.

3) Intermediate Transferring Medium

The intermediate transferring medium shown in FIG. 4a can be constituted by laminating an interlayer and an image-receiving layer on a substrate in this order. As the substrate of the intermediate transferring medium, materials usable for the support of the image-forming element are optionally used. The thickness of the medium is selected from the range of generally 10 to 500 µm, preferably 25 to 200 µm.

The image-receiving layer can be constituted by a binder resin and an additive to be added according to the necessity, and the composition the layer can be varied in accordance with the kind of the transferring element. As the binder resin of the image-receiving layer, natural substance and derivative thereof such as polyvinyl alcohol, starch, corn starch, casein, gelatin; cellulose resins, vinyl chloride resins, acryl resins, polyolefin resins, polyurethane resins, epoxy resins, polyester resins, polyvinyl acetal resins, polyamide resins, styrene resins, polycarbonate, polyvinyl alcohol, polyvinyl pyrrolidone, polysulfon, polycaprolactone resin, polyacrylonitril resin, urea resin are phenoxy resin usable. The resin may be used singly or two or more in combination. The content of the binder in the image-receiving layer is preferably to be generally 30 to 300%, preferably 50 to 100%, by weight based on the total weight of the image-receiving layer.

The additive to be added to the color-forming layer of FIG. 1a may be added to the image-receiving layer as long as the receiving property of the layer is not disturbed.

The thickness of the image-receiving layer is optionally set within the range of generally 0.1 to 30 µm, preferably 0.5 to 20 µm.

The intermediate layer may be provided for making a contact ability with the transferring layer and/or color-forming layer, or improving the peeling ability of the image-receiving layer from the substrate.

For the interlayer provided for making the contact ability, various materials having a low elasticity or a gum-elasticity can be selected for use. In concrete, elastomers such as natural gum, acrylate gum, butyl gum, nitril gum, butadiene gum, isoprene gum, styrene-butadiene gum, chloroprene gum, urethane gum, silicone gum, acryl gum, fluorine gum, neoprene gum, chlorosulfonized polyethylene, epichlorohydrin, ethylene-propirene-diene gum (EPDM), urethane elastomer; and resins such as polyethylene, polypropylene, polybutadiene, polybutene, polyurethane, styrene-butadiene copolymer, ethylene-vinyl acetate copolymer, acrylonitril-butadiene copolymer, polyvinyl chloride and polyvinylidene chloride are usable.

A cushion property can be given by composing the substrate by the above-mentioned materials.

The cushion layer can be foamed by coating the material dissolved in an organic solvent or that dispersed in a form of latex on the substrate by means of a blade coater, roller coater, bar coater, curtain coater, or gravure coater, by laminating the hot melt material by extruding lamination method, or by sticking the material in a form of film sheet with the substrate.

The interlayer for giving releasing ability can be formed by a resin having a weak contacting ability or a resin containing a compound known as a leasing agent such as silicone compounds, fluorine-containing compounds or surfactants.

When the interlayer is provided, the thickness thereof is generally 0.1 to 30 μm, preferably 0.5 to 20 μm.

A backing layer may be provided on the surface of the substrate opposite to the surface on which the image-receiving layer is provided for the purpose of donating a heat resistivity, antistatic ability, double feeding prevention, lubricity donation and curing prevention. The backing layer may be constituted optionally according to the constitution and thickness described with respect to the image-forming element of FIG. 1a.

The intermediate transferring medium can be prepared in a manner similar to that in the image-forming element of FIG. 1a.

4) Protective Layer

For the protective layer in the invention, one formed by transferring only a resin layer such as a transferring resin foil or one formed laminating a resin film may be optionally used according to the use thereof.

In the case shown in FIG. 7a, a resin film is used as the protective layer, which is composed of a substrate and a adhesive resin layer provided on the support.

As the above substrate, those similar to the support to be used for the image-forming layer can be optionally used. A substrate having a transparency of not less than 70% and a thickness of 6 to 100 μm, preferably 10 to 50 μm, is preferably used when the image is observed from the side of the color-forming layer.

The adhesive layer may be optionally composed of a material originally adhesive at a room temperature or that capable of displaying an adhesiveness when pressure or heat is applied. Such the material can be prepared in concrete by mixing a resin having a low softening point or an adhesiveness donating agent with a thermally fusible substance and/or thermoplastic substance. The material can also be prepared by adding an adhesive substance enclosed in a microcapsule by a known method to the thermally fusible substance and/or thermoplastic substance.

As the resin having a low softening point usable in the adhesive layer, ethylene copolymers such as ethylene-vinyl acetate copolymer and ethylene-ethyl acrylate copolymer; polyamide resins such as nylon; polystyrene resins such as styrene-butadiene resin, styrene-isoprene resin and styrene-ethylene-butylene resin; polyester resins; polyolefin resins; polyvinyl ether resins; polymethyl methacrylate resins; ionomer resins; cellulose resins; polyurethane resins; acryl resins; epoxy resins; melamine resins and vinyl chloride resins can be described.

As the adhesiveness donating agent, for example, unmodified and modified rosin adhesiveness donating agents including rosin adhesiveness donating agent, hydrogenated adhesiveness donating agent, maleic acid-modified rosin adhesiveness donating agent, polymerized adhesiveness donating agent and phenol-modified rosin adhesiveness donating agent; terpene adhesiveness donating agents; and petroleum resin adhesiveness donating agents can be described.

As the thermally fusible substance usable in the adhesive layer, those described with respect to the image-forming element of FIG. 1a may be optionally used.

The thickness of the adhesive layer is generally 0.1 to 20 μm, preferably 0.3 to 10 μm.

Besides, in the case of using the transferring foil, an element composed of a substrate, and a surface layer and a adhesive layer provided on the substrate in this order. A peeling layer may further be provided, according to necessity, to control the adhesiveness between the substrate and the surface layer.

As the adhesive layer, the adhesive layer for the protective layer shown in FIG. 1c may be optionally applied.

The peeling layer may be composed of a releasing layer described in the image-forming element of FIG. 1a, a binder resin and an additive.

The thickness of the substrate is generally 6 to 100 μm, preferably 10 to 50 μm, and the thickness of the peeling layer, the surface layer and adhesive layer are each generally 0.01 to 20 μm, preferably 0.1 to 10 μm.

EXAMPLES

The present invention is described below in detail according to examples. Embodiments of the invention is not limited thereto. In the examples, the density of image is measured by Visual density mode of the densitometer X-rite 310TR manufactured by X-rite Co., and "parts" means "parts by weight".

Example 1

(1) Preparation of Image-Forming Element

A coating solution of color-forming layer was prepared by mixing the following materials.

| Coating solution of color-forming layer | |
| --- | --- |
| Hexa-ammine cobalt (III) trifluoroacetate | 1.8 parts |
| o-phthalaldehyde | 2.9 parts |
| polyvinyl butyral resin (Elex BL-1 produced by Sekisui Kagaku-kogyo) | 8.0 parts |
| Methyl ethyl ketone | 250 parts |
| Acetone | 100 parts |

The above-mentioned coating solution was coated on a polyethylene terephthalate film (PET film) having a thickness of 100 μm by means of a wire-bar coater so that the layer thickness after drying is to be 10 μm and dried. Thus an image-forming sheet having a color-forming layer on PET film was prepared.

(2) Preparation of Transferring Element

An interlayer of SBSE (Clayton G1657 produced by Shell Chemical Co.) having a dry-thickness of 6 μm and the following light-heat converting layer were coated on a PET film of 100 μm by means of a wire-bar coater so that the optical density of the absorption at 830 nm is to be 1.0

| Coating solution of light-heat converting layer | |
|---|---|
| IR absorbing dye | 3 parts |

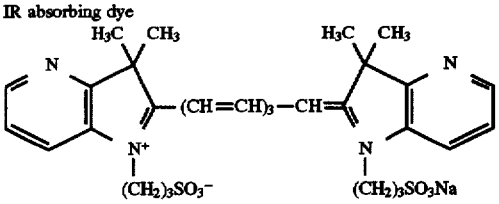

| gelatin | 6.7 parts |
|---|---|
| Sodium iso-amyldectlsulfosuccinate | 0.2 parts |
| Water | 250 parts |
| Ethanol | 20 parts |

On the coated layer, a transferring layer having the following composition was further coated by a wire-bar coater so that the dry-thickness of the layer is to be 0.5 μm.

| Coating solution of transferring layer | |
|---|---|
| 2-iso-propoxy-1,4-naphthoquinone | 2 parts |
| Carbon black | 4 parts |
| Styrene-acryl resin (Himer SBM73F, Sanyo Kasei Co.) | 5.4 parts |
| EVA (Evaflex EV-40Y, Mitsui-du Pont Polychemical Co.) | 0.5 parts |
| Surfactant (Surfron S-382, Asahi Glass Co.) | 0.1 parts |
| Methyl ethyl ketone | 80 parts |
| Cyclohexanone | 10 parts |

(3) Image Formation

The procedure of image formation is described below according to FIGS. 2a to 2e.

1) The image-forming element 5 and the transferring element 9 were set so as to face the color-forming layer 1 and the transferring layer 3 of each of the elements as shown in FIG. 2a. The elements were contacted by vacuum on a cylindrical drum in the order of image-forming element/ transferring element as shown in FIG. 2b, and imagewise exposed to light from a laser diode 7 emitting light of 830 nm. The exposure was carried out under the conditions of the intensity of light at the exposing surface of 100 mW, the diameter of light beam of 10 μm in terms of $1/e$ value, and the moving pitch in the sub-scanning direction of 6 μm.

2) The transferring element 9 was peeled off from the image-forming element. After the peeling, the portion of the transferring layer exposed to laser light was wholly transferred on the image forming layer as a result of the exposed portion of the transferring layer was fused by heat converted from the energy of light irradiated to this portion and adhered on the color-forming layer, as shown in FIG. 2c.

3) Then the image-forming element was thermally treated by a heat roller under the conditions of a heating temperature of 100° C., a transporting speed of 15 mm/sec., and a pressure of 1.5 kg/cm, so that 2-iso-propoxy-1,4-naphthoquinone in the transferring layer transferred on the color-forming layer was thermally diffused into the color-forming layer, as shown in FIG. 2d.

4) At last, the image-forming element treated by the above 3) was uniformly exposed to light using a xenon lump 8, and further heated by a heat roller under the conditions of a heating temperature of 110° C., a transporting speed of 15 mm/sec., and a pressure of 1.5 kg/cm, as shown in FIG. 2e. Thus a clear black positive image having a transparent density of 3.21 was obtained.

Example 2

(1) Preparation of Image-Forming Element

A coating solution of color-forming layer for a image-forming element was prepared by mixing the following materials.

| Coating solution of color-forming layer | |
|---|---|
| 2-iso-propoxy-1,4-naphthoquinone | 0.6 parts |
| o-phthalaldehyde | 2.9 parts |
| polyvinyl butyral resin (Elex BL-1, Sekisui Kagaku-kogyo) | 8.0 parts |
| Methyl ethyl ketone | 250 parts |
| Acetone | 100 parts |

The above-mentioned coating solution was coated on a PET film of 100 μm by means of a wire-bar coater so that the layer thickness after drying is to be 10 g/m² and dried. Thus an image-forming sheet having a color-forming layer on PET film was prepared.

(2) Preparation of Transferring Element

A transferring element was prepared in the same manner as in Example 1 except that the composition of the transferring layer was changed as follows.

| Coating solution of transferring layer | |
|---|---|
| Hexa-ammine cobalt (III) trifluoroacetate | 4 parts |
| Carbon black | 4 parts |
| Styrene-acryl resin (Himer SBM73F, Sanyo Kasei Co.) | 5.4 parts |
| EVA (Evaflex EV-40Y, produced by Mitsui-du Pont Polychemical Co.) | 0.5 parts |
| Surfactant (Surfron S-382, Asahi Glass Co.) | 0.1 parts |
| Methyl ethyl ketone | 80 parts |
| Cyclohexanone | 10 parts |

(3) Image Formation

A clear black positive image having a transparent density of 2.56 was obtained by image forming procedure the same as in Example 1.

Example 3

(1) Preparation of Image-Forming Element

An image forming element was prepared in the same manner as in Example 1 except that the coating solution is changed as follows.

| Hexa-ammine cobalt (III) trifluoroacetate | 1.8 parts |
|---|---|
| 4-t-butyl-1,3-phthalaldehyde | 4.5 parts |
| polyvinyl chloride resin (TK-300, Sin'etu Kagaku-kogyo) | 8.0 parts |
| Methyl ethyl ketone | 200 parts |
| Cyclohexanone | 50 parts |

(2) Image Formation

The image formation procedure the same as in Example 1 was carried out using the above-obtained image-forming element and the transferring element prepared in Example 1. Thus a clear black positive image having a transparent density of 3.03 was obtained.

Example 4

(1) Preparation of Transferring Element

An element was prepared in a similar manner to the transferring element in Example 1, which has the constitution of substrate/interlayer/light-heat converting layer. Further on the light-heat layer, a transferring layer composed of the following composition was coated by a wire-bar coater so that the layer thickness is to be 0.5 μm to prepare a transferring element.

| Coating solution of transferring layer | |
|---|---|
| 2-iso-propoxy-1,4-naphthoquinone | 2 parts |
| polyvinyl butyral resin (Elex BL-1, Sekisui Kagaku-kogyo) | 8.0 parts |
| Methyl ethyl ketone | 250 parts |

(2) Image Formation

The image formation procedure is described according to FIGS. 3a to 3e

1) The image-forming element 5 obtained in Example 1 and the above-obtained transferring element 9 were set so as to face the color-forming layer 1 to the transferring layer 3 of the each element as shown in FIG. 3a. The elements were contacted by vacuum on a cylindrical drum in the order of image-forming element/transferring element as shown in FIG. 3b, and imagewise exposed to light from a laser diode 7 emitting light of 830 nm in the same manner as in Example 1. Thus 2-iso-propoxy-1,4-naphthoquinone in the portion of the transferring layer exposed to laser light was transferred into the image forming layer by heat converted in the light-heat converted layer from the energy of irradiated light.

2) The transferring element 9 was peeled off from the image-forming element. As a result, the image-forming element having the color-forming layer in which 2-iso-propoxy-1,4-naphthoquinone was imagewise transferred is obtained as shown in FIG. 3c.

3) Then the image-forming element was thermally treated by a heat roller under the conditions of a heating temperature of 100° C., a transporting speed of 15 mm/sec., and a pressure of 1.5 kg/cm, so that 2-iso-propoxy-1,4-naphthoquinone transferred on the color-forming layer was thermally diffused into the color-forming layer, as shown in FIG. 3d.

4) At last, the image-forming element treated by the above 3) was uniformly exposed to light using a xenon lump 8, and further heated by a heat roller under the conditions of a heating temperature of 110° C., a transporting speed of 15 mm/sec., and a pressure of 1.5 kg/cm, as shown in FIG. 3e. Thus a clear black positive image having a transparent density of 3.47 was obtained.

Example 5

(1) Preparation of Image-Forming Element

A coating solution of a curable layer was prepared by mixing the following composition.

| Coating solution of curable layer | |
|---|---|
| polymethyl methacrylate (Dianal BR-83, Mitsui Rayon Co.) | 10 parts |
| Dipentaerythritol hexaacrylate (KAYARAD DPHA, Nohon Kayaku Co.) | 25 parts |
| EO-modified tetrabromobisphenol A dimethacrylate (New Frontier, Daiichi Seiyaku Co.) | 10 parts |
| Azobis-iso-butylonitryl | 0.8 parts |
| IR absorbing dye (IR-820B, Nohon Kayaky Co.) | 0.8 parts |
| Methyl ethyl ketone | 50 parts |

A surface of a PET film having a thickness of 38 μm, T-100, Diafoil-Hechst Co., was subjected to corona discharge treatment. The above coating solution of curable layer was coated and dried On the treated surface of the film to form a curable layer having a thickness of 1.0 μm. On the surface of the curable layer, the following transferring layer was provided so that the dry-thickness of the transferring layer is to be 1.5 μm.

| Coating solution of transferring layer | |
|---|---|
| 5,5-dimethylhydantoin | 2 parts |
| Microcrystaline wax | 6.5 parts |
| EVA (Evaflex EV-210, Mitsui-du Pont Co.) | 0.5 parts |
| Styrene-acryl resin (Himer SBM-100, Sanyo Kasei Co.) | 1 part |
| Methyl ethyl ketone | 100 parts |

At last, the transferring layer was sticked at a room temperature with the color-forming layer prepared in Example 1to prepare a transfer element.

2) Image Formation

Image forming procedure using the above-obtained element is described below according to FIGS. 1a to 1d.

1) The support side, i.e., side of the 100 μm-PET film, of the above-obtained image forming element shown in FIG. 1a was contacted by vacuum on the cylindrical drum and exposed imagewise to light of 830 nm emitted from a laser diode by scanning as shown in FIG. 1b. The exposure was carried out under the conditions of the intensity of light at the exposing surface of 100 mW, the diameter of light beam of 10 μm in terms of ½e value, and the moving pitch in the sub-scanning direction of 6 μm.

2) Then the substrate, the 38 μm PET film, was peeled off from the image-forming element to transfer only the unexposed portion of the transferring layer onto the color-forming layer.

3) The image-forming layer was treated with a heat roller under the conditions of a heating temperature of 140° C., a transporting speed of 25 mm/sec., and a pressure of 1.0 kg/cm, as shown in FIG. 1e. Thus a clear negative image having a blue-black tone and a transparent density of 4.09.

Example 6

(1) Preparation of Image-Forming Element

The following curable layer coating solution containing a polymerizable compound and a polymerization initiator is coated by a wire-bar coater on the color-forming layer of the image-forming element prepared in Example 1 and dried to form a curable layer having a thickness of 1.0 μm.

| Coating solution of curable layer | |
|---|---|
| Styrene-ethylene-propylene gum-acrylonitril copolymer (JSR AES117, Nihon Gousei Gomu Co.) | 10 parts |
| Trimethylpropane triacrylate (ARONIX M-309, Toa Gousei-kagaku Kogyo Co.) | 18 parts |

-continued

| Coating solution of curable layer | |
|---|---|
| Pentadieneerythritol hexaacrylate (KAYARAD DPHA, Nihon Kayaku Co.) | 20 parts |
| 3,3'-carbonyl-bis(7-diethylaminocumarin) | 2.5 parts |
| Diphenylphenacylsulfonium tetrafluloroborate | 2.5 parts |
| Toluene | 200 parts |
| Methyl ethyl ketone | 200 parts |

On the other hand, a thermally fusible transferring layer having the following composition was coated and dried on a PET film S, product of Diafoil-Hoechst Co., having a thickness of 25 μm as the substrate, so as to form a layer having a thickness of 1 μm. The thermally fusible layer provided on the substrate was faced and sticked with the curable layer provided on the color-forming layer of the image-forming element by means of a heat roller under the conditions of a heating temperature of 50° C., a transporting speed of 25 m/sec. and pressure of 1.2 kg/cm. Thus an image forming element was prepared.

| Coating solution of thermally fusible transferring layer | |
|---|---|
| Microcrystaline wax | 6.5 parts |
| EVA (Evaflex EV-210, Mitsui-du Pont Co.) | 0.5 parts |
| Styrene-acryl resin (Himer SBM-100, Sanyo Kasei Co.) | 1 part |
| Propyl gallate | 2 parts |
| Methyl ethyl ketone | 100 parts |

(2) Image Formation

1) The image-forming element was wedgewise exposed to light by one-shot from the side of the substrate by means of a xenon lump through a filter cutting off light of not less than 500 nm. The exposure energy of 500 mJ/cm$^2$ was given to the element.

2) Then the substrate was peeled off from the image-forming element. As a result of that, unexposed portion of the transferring layer was only transferred onto the color-forming layer because the exposed portion of the curable layer was cured by light exposure and the adhessiveness thereof was lost.

3) The image-forming element was heated by a heat roller under the conditions of a heating temperature of 100° C., a transporting speed of 25 m/sec. and a pressure of 1.2 kg/cm. Thus a clear black negative image having a transparent density of 2.28 was obtained. In the image, a line having a width of 10 μm was clearly reproduced, and the exposure energy necessary to form the image was 0.8 mJ/cm$^2$.

Example 7

(1) Preparation of Image-Forming Element

The following coating solution of color-forming layer was coated on a support of a PET film having a thickness of 100 μm by means of a wire-bar coater so that a color-forming layer having a thickness of 10 μm was provided.

| Coating solution of color-forming layer | |
|---|---|
| Hexa-ammine cobalt (III) trifluoroacetate | 1.8 parts |
| o-phthalaldehyde | 2.9 parts |
| EVA (Evaflex EV-210, Mitsui-du Pont Co.) | 8 parts |
| Methyl ethyl ketone | 250 parts |
| Acetone | 100 parts |

On the other hand, a side of a substrate of PET film having a thickness of 50 μm is subjected to corona discharge of 80 W/m$^2$/min. The following curable transferring layer composition was coated on the discharge-treated surface of the substrate by a sire bar so as to form a curable layer having a dry-thickness of 4 μm.

| Solution of curable transferring layer | |
|---|---|
| Dipentaerithrytol hexaacrylate (KAYARAD DPHA, Nihon Kayaku Co.) | 30 parts |
| polymethyl methacrylate (Dianal BR-83, Mitsubishi Rayon Co,) | 30 parts |
| 5,5-dimetylhydantoin | 15 parts |
| Carbon black | 15 parts |
| Dispersant (a mixture of 0.5 parts of SOLSPERSE 24000GR and 0.1 parts of SOLSPERSE 13240, ICI Co.) | 0.6 parts |
| Cyanine dye (Kayasorb CY-19, Nihon Kayaku Co,) | 0.6 parts |
| Lithium butyltriphenylborate | 1.7 parts |
| 1-phenyl-5-mercaptotetrazole | 0.9 parts |
| Methyl ethyl ketone | 400 parts |

At last, the color-forming layer provided on the support and the curable transferring layer provided on the substrate were contacted with together and sticked by a heat roller under the conditions of a heating temperature of 50° C., a transporting speed of 25 mm/sec. and a pressure of 1.2 kg/cm.

(2) Image Formation

The procedure for image formation is described blow according to FIGS. 1a to 1d.

1) The image-forming element the above-obtained shown in FIG. 1a was contacted by vacuum on a cylindrical drum, and imagewise exposed to light from a laser diode 7 emitting light of 830 nm by scanning. The exposure was carried out under the conditions of the intensity of light at the exposing surface of 100 mW, the diameter of light beam of 10 μm in terms of ½e value, and the moving pitch in the sub-scanning direction of 6 μm.

2) Then the substrate was peeled from the image-forming element. As a result of peeling, the portion of the transferring layer where the layer was cured by the laser light exposure, was remained on the substrate and the unexposed portion of the curable transferring layer was transferred onto the color-forming layer as shown in FIG. 1c.

3) The image-forming element was heated by a heat roller under the conditions of a heating temperature of 140° C., a transporting speed of 20 mm/sec, and a pressure of 1.2 kg/cm. Thus a clear black negative image having a blue-black tone and a transparent density of 2.28 was obtained. In the image, a line having a width of 10 μm was clearly reproduced, and the exposure energy necessary to form the image was 0.8 mJ/cm$^2$.

Example 8

(1) Preparation of Image-Forming Element

The following coating solution of ablating layer was coated on the color-forming layer of the image-forming element obtained in Example 1 by a wire-bar coater and dried to form a ablating layer having a dry thickness of 0.8 μm. Thus an image-forming element was prepared.

| Coating solution of ablating layer | |
|---|---|
| 2-(2-hydroxyethyl)-1,4-naphthoquinone | 20 parts |
| Gelatin | 3.5 parts |
| IR absorbing dye | 1.5 parts |

| Coating solution of ablating layer | |
| --- | --- |
| [Structure: H₃C CH₃ groups on two indoline units connected by (CH=CH)₃—CH= bridge, with N⁺–(CH₂)₃SO₃⁻ and N–(CH₂)₃SO₃Na substituents] | |
| pure water | 95 parts |

The procedure of image formation is described according to FIGS. 5a to 5d.

1) As shown in FIG. 5a, the above-obtained image forming element was contacted on a cylindrical drum by vacuum so that the ablating layer is to be outside. The ablating layer was imagewise ablated by scanning as shown in FIG. 5b, with a beam of light of 830 nm having a diameter of 6 μm formed by condensing the light generated from a laser diode. The light-intensity of the laser diode was 100 mW.

2) After the ablation, the image-forming element is subjected to a heat treatment by a heat roller to thermally diffuse 2-(2-hydroxyethyl)-1,4-naphtoquinone contained in the ablating layer, which is provided on the color-forming layer, into the color-forming layer. The heat treatment was carried out under the conditions of a heating temperature of 100° C., a transporting speed of 15 mm/sec. and a pressure of 1.5 kg.

3) At last, the image-forming layer was uniformly exposed to light by means of a printer for light-sensitive film to be used in a lighted room P-627-HA, manufactured by Dainihon Screen Co., as shown in FIG. 5c. Energy of the exposure was 500 mJ/cm², and the exposure was performed by one-shot. Then the image-forming element was subjected to a heat treatment as shown in FIG. 5d by a heat roller under the conditions of a heating temperature of 110° C., a transporting speed of 15 mm/sec, and a pressure of 1.5 kg/cm. Thus a clear black negative image having a transparent density of 3.20 was obtained.

Example 9

(1) Preparation of Image-Forming Element and Transferring Element

An image-forming element and a transferring element were each prepared in the manner the same as in Example 1.

(2) Preparation of Intermediate Transferring Medium

As an interlayer, a solution of EVA, foregoing EV-40Y, was coated and dried on a substrate of PET film 100 T having a thickness of 38 μm, manufactured by Diafoil-Hoechst Co.) so as the dry-thickness to be 15 μm by means of a comma-doctor coater. On the other hand, an image-receiving layer having the following composition was coated on a peelable support by wire-bar coater so as to the thickness to be 1.5 μm. Further on the image-receiving layer, a solution of methyl cellulose, SM15 manufactured by Shin'etsu Kagaku-kogyo Co., is coated by a wire-bar coater so as to the dry-thickness to be 0.8 μm. The above-obtained sheets were sticked with together and the peelable support was peels off. Thus an intermediate transferring medium was obtained which had a constitution of Substrate/Interlayer/peeling layer/Image-receiving layer.

| Coating solution of image-receiving layer | |
| --- | --- |
| Acryl resin (BR-113, Mitsubishi Rayon) | 9.85 parts |
| Silicone resin (foregoing Tosparl 130) | 0.15 parts |
| Methyl ethyl ketone | 31.5 parts |
| Cyclohexanone | 31.5 parts |
| Iso-propyl alcohol | 27.0 parts |

(3) Image Formation

The image formation procedure is described according to FIGS. 4a to 4e.

1) As shown in FIG. 4a, the intermediate transferring medium and the transferring element were contacted by vacuum on a cylindrical drum in this order, and imagewise exposed by scanning to laser diode light of 830 nm under the conditions of exposure intensity of 100 mW, the diameter of light beam of 10 μm in terms of ½e value and the moving pitch in the sub-scanning direction of 6 μm to transfer the transferring layer.

2) The transferring element was peeled off from the intermediate transferring medium. As a result of the peeling, exposed portion of the transferring layer was transferred together with the binder thereof on the image-receiving layer 13 of the intermediate transferring medium as shown in FIG. 4b.

3) Further, the intermediate transferring medium, on which the exposed portion of the transferring layer was transferred, was contacted as shown in FIG. 4c. The contacted element and medium were subjected to a heat treatment by heat roller to be unitized together with and to 2-iso-propoxy-1,4-naphtoquinone contained in the transferring layer into the color-forming layer of the image-forming element united with the image-forming element by a heat treatment as shown in FIG. 4d.

4) At last, the unitized sheet composed of the intermediate transferring medium and the image-forming element was uniformly exposed to light and was treated by a heat roller under the conditions of a heating temperature of 110° C., transporting speed of 15 m/sec, and pressure of 1.5 kg/cm. Thus a clear black negative image having a transparent density of 3.14 was obtained.

Example 10

(1) Preparation of Image-Forming Element

The following ablating coating solution was coated by a wire-bar coater on the color-forming layer of the image-forming element prepared in Example 1 so as the dry-thickness of the layer to be 1 μm.

| Coating solution of ablating layer | |
| --- | --- |
| gelatin | 3.5 parts |
| IR absorbing dye | 1.5 parts |
| [Structure: H₃C CH₃ groups on two indoline units connected by (CH=CH)₃—CH= bridge, with N⁺–(CH₂)₃SO₃⁻ and N–(CH₂)₃SO₃Na substituents] | |
| Pure water | 95 parts |

(2) Preparation of Transferring Element

A transferring element was prepared in the same manner as in Example 1 except that the transferring layer is replaced by one having the following composition and a thickens of 0.5 μm.

| Coating solution of transferring layer | |
|---|---|
| 5,5-dimethylhydantoin | 2 parts |
| Carbon black | 4 parts |
| Styrene-acryl resin (Himer SBM73F, Sanyo Kasei Co.) | 5.4 parts |
| EVA (Evaflex EV-40Y, Mitsui-du Pont Polychemical Co.) | 0.5 parts |
| Surfactant (Surfron S-382, Asahi Glass Co.) | 0.1 parts |
| Methyl ethyl ketone | 80 parts |
| Cyclohexanone | 10 parts |

(3) Image Formation

The procedure of image formation is described according to FIGS. 6a to 6d.

1) The image-forming element is contacted by vacuum on a cylindrical drum so as the ablating layer to be outside as shown in FIG. 6a. The image-forming element was imagewise exposed to ablate imagewise the ablating layer by scanning to laser diode light of 830 nm under the conditions of exposure intensity of 100 mW, the diameter of light beam of 10 μm in terms of ½e value and the moving pitch in the sub-scanning direction of 6 μm as shown in FIG. 6b.

2) After that, as shown in FIG. 6c, the ablating layer of the image-forming element is contacted with the transferring layer of the transferring element and heated by a heat roller under the conditions of a heating temperature of 130° C., transporting speed of 20 mm/sec, and pressure of 1.5 kg. Then the transferring element was peeled off from the image-forming element. Thus a clear black positive image with blue-black tone having a transparent density of 4.09.

Example 11

(1) Preparation of Image-Forming Element

On a support of PET film, T-100 manufactured by Diafoil-Hoechst co., having a thickness of 100 μm, the following coating solutions of interlayer and color-forming layer were coated in this order by a wire-bar coater so as the thickness of each layers was 0. and 11.0 μm, respectively, to prepare an image-forming element composed of support/interlayer/color-forming layer.

| Coating solution of interlayer | |
|---|---|
| Saturated polyester resin (Bilon 200, Toyo Bo Co.) | 0.04 parts |
| Methyl ethyl ketone | 0.96 parts |
| Coating solution of color-forming layer | |
| Hexa-ammine cobalt (III) trifluoroacetate | 0.09 parts |
| 4-t-butyl-1,2-phthalaldehyde | 0.205 parts |
| Polyvinyl acetal resin (BL-1, Sekisui Kagaku-kogyo Co.) | 0.4675 parts |
| Acetone | 0.47 parts |
| Methyl ethyl ketone | 1.40 parts |

(2) Preparation of Transferring Element

A two-axis stretched transparent polyethylene terephtharate film having a thickness of 6 μm, K203E-6F manufactured by Diafoil-Hoechst Co., was used, one side of which had been subjected to a treatment to give an adhesiveness. The opposite side of the support to the above treated side was subjected to a corona discharge treatment, and a methyl ethyl ketone solution containing 5 weight % of a modified-silicone resin, Dialomer SP712, manufactured by Dainichi Seika-kogyo Co., was coated on the surface and dried so as to form a backing layer having a thickness 0.2 μm. Then the following coating solution of transferring layer was coated by a wire-bar coater on the adhesive-treated surface of the support and dried to form a transferring layer having a thickness of 1.5 μm. Thus a transferring element was prepared.

| Coating solution of transferring layer | |
|---|---|
| Methyl gallate (Tokyo Kasei Co.) | 0.2 parts |
| Polyvinyl acetal resin (KS-1, Sekisui Kagaku-kogyo Co.) | 0.8 parts |
| Methyl ethyl ketone | 8.0 parts |
| Cyclohexanone | 1.0 parts |

(3) Image Formation

The procedure of image formation is described according to FIGS. 3a to 3e.

1) The transferring layer of the transferring element was contacted with the color-forming layer of the image-forming element as shown in FIGS. 3a and 3b, and on which a gray scale test pattern having gradation of 256 steps (0 to 255) was imagewise recorded by means of a thermal-sublimation transferring printer, Color Printer CHC-S545 manufactured by Shinko Denki Co. As the result, to the image-forming element as shown in FIG. 3c.

2) Then the image-forming element, on which methyl gallate was imagewise transferred, was treated by a heat roller under the conditions of a heating temperature of 120° C., transporting speed of 20 mm/sec. and pressure of 1.5 kg/cm, as shown in FIG. 3d. Thus a black positive image with gradation having a transparent density of 3.17 was formed as shown in FIG. 3e.

Example 12

An image-forming element was prepared in the same manner as in Example 11 except that methyl gallate was replace by the same quantity of 5,5-diphenylhydantoin. An image forming procedure carried out in the same manner as in Example 11 except that the above image-forming element was used therein. Thus a blue-black tone positive image with gradation having a transparent density of 3.88 was formed.

Example 13

(1) Preparation of Image-Forming Element

One side of a blue-tinted transparent PET film having a thickness of 175 μm to be used as a support was subjected to corona discharge treatment. Then an aqueous solution containing 5% by weight of polyester resin, Dianal MD1200 manufactured by Toyo-bou Co., was coated by a wire-bar coater on the treated surface of the support and dried so as to form an interlayer having a thickness of 0.2 μm. On the other hand, a coating solution of color-forming layer having the following composition was prepared and coated on the surface of the above interlayer by a wire-bar coater and dried to form a color-forming layer having a thickness of 10 μm. Thus an image-forming element was prepared.

| Coating solution of color-forming element | |
|---|---|
| Hexa-ammine cobalt (III) trifluoroacetate | 0.09 parts |
| 4-t-butyl-1,2-phthalaldehyde | 0.20 parts |
| Dioctyl phthalate | 0.10 parts |
| Polyvinyl alcohol (Gosenol GL-05, Nihon Gosei-kogyo Co.) | 0.61 parts |
| $C_{12}H_{25}N^+(CH_3)_2CH_2CH_2CH_2SO_3^-$ | 0.001 parts |
| Distilled water | 4.0 parts |

(2) Image Formation

The above-obtained image-forming element and the transferring element obtained in Example 12 were treated in the same procedure as in Example 11. As a result, a blue-black tone black positive image with gradation having a transparent density of 4.73 was formed.

Comparative Example 1

(1) Preparation of Image-Forming Element

A coating solution of color-forming layer prepared by mixing the following materials was coated on a support of 100 μm PET film by a wire-bar coater so as to form a layer having a thickness of 10 μm and dried. Thus an image-forming element was prepared.

| Coating solution of color-forming layer | |
| --- | --- |
| Hexa-ammine cobalt (III) trifluoroacetate | 1.8 parts |
| o-phthalaldehyde | 2.9 parts |
| Polyvinyl butyral resin (Elex BL-1, Sekisui Kagaku-kogyo Co.) | 8.0 parts |
| Methyl ethyl ketone | 250 parts |
| Acetone | 100 parts |
| 2-iso-propoxy-1,4-naphthoquinone | 2 parts |

(2) Image Formation

1) The image-forming element was imagewise exposed to light from a xenon lump with energy of 500 mJ/cm$^2$ by one-shot through a filter cutting wavelength of not more than 500 nm and an optical wedge.

2) After that, image-forming element was treated by a heat roller under the conditions of a heating temperature of 100° C., transporting speed of 25 mm/sec. and pressure of 1.2 kg/cm, thus a black positive image having a transparent density of 2.01 was formed.

The storage ability of the images formed in Examples 1 to 13 and Comparative example 1 were evaluated by standing the image-forming elements, on each of which an image had been formed, for 30 days at a room temperature. The maximum density and the minimum density or density of non-image portion were measured by the densitometer in visual mode at the times of before and after the standing the storage. The evaluation was carried out by using the values of ODmax-RT=(maximum density after storage−maximum density before storage) and ODmin-RT=(minimum density after storage−minimum density before storage). Results of the evaluation are listed in the following table.

| Example No. | Image density before storage | ODmax-RT | ODmin-RT |
| --- | --- | --- | --- |
| Example 1 | 3.21 | −0.20 | 0.00 |
| Example 2 | 2.56 | −0.15 | 0.00 |
| Example 3 | 3.03 | −0.21 | 0.00 |
| Example 4 | 3.47 | −0.21 | 0.00 |
| Example 5 | 4.09 | −0.10 | 0.00 |
| Example 6 | 2.28 | −0.15 | 0.00 |
| Example 7 | 4.53 | −0.11 | 0.00 |
| Example 8 | 3.20 | −0.20 | 0.00 |
| Example 9 | 3.14 | −0.20 | 0.00 |
| Example 10 | 4.09 | −0.10 | 0.00 |
| Example 11 | 3.17 | −0.17 | 0.00 |
| Example 12 | 3.88 | −0.11 | 0.00 |
| Example 13 | 4.73 | −0.13 | 0.00 |
| Comp. Ex. 1 | 2.01 | −0.59 | 0.79 |

What is claimed is:

1. An image forming method comprising
   providing a first support having thereon a first layer containing one or two components selected from the group consisting of (1) a cobalt (III) complex having an ammonia ligand or having a primary amine ligand, (2) a compound capable of having its absorption wavelength changed by ammonia or a primary amine, and (3) a compound or precursor thereof which causes said ammonia or said primary amine to be easily released therefrom, said method comprising
   imagewise forming, on said first layer, a second layer containing said components not in said first layer, according to image information.

2. The image forming method of claim 1 comprising reacting said components in said first layer with said components in said second layer thereby to form said image.

3. The image forming method of claim 1 wherein said second layer contains a compound or precursor thereof which causes said ammonia or primary amine contained in said complex as a ligand to be easily released from said complex.

4. The image forming method of claim 1 comprising
   imagewise removing said second layer by applying energy according to said image information.

5. The image forming method of claim 1 comprising providing said second layer on a second support different from said first support, imagewise removing said second layer from said second support by applying energy according to image information, and contacting said second layer on said second support after said imagewise removing.

6. The image forming method of claim 2 wherein said reacting is carried out by heating.

7. The image forming method of claim 1 comprising applying a protective layer to said image.

8. The image forming method of claim 5 wherein a light-heat converting agent is provided between said second layer and said second support.

9. The image forming method of claim 1 wherein said compound capable of having its absorption wavelength changed is an aromatic dialdehyde.

10. The image forming method of claim 4 wherein said imagewise removing comprises peeling off said second layer after applying said energy.

11. The image forming method of claim 4 wherein said imagewise removing comprises ablating said second layer after applying said energy.

12. The image forming method of claim 4 wherein a curable layer containing a polymerizable compound and a polymerization initiator is adjacent said first layer or said second layer.

13. The image forming method of claim 10 wherein said applying energy is carried out by means of a thermal head.

14. The image forming method of claim 10 wherein said applying energy is carried out by means of laser light.

15. The image forming method of claim 14, wherein the wavelength of said laser light is within the range of 600 nm to 1200 nm.

16. The image forming method of claim 1, wherein one of said first layer and said second layer contains a light-heat converting agent.

17. The image forming method of claim 1, wherein said support has a transparent density of not more than 0.2.

18. The image forming method of claim 1, wherein said compound or a precursor thereof which makes ammonia or primary amine contained in the cobalt(III) complex as a ligand to be easily released from the complex is a compound represented by the following Formula 1;

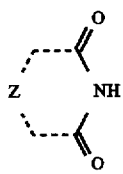
Formula 1
wherein Z presents a group of atoms necessary to form a five-, six- or five-member ring.
19. The image forming method of claim 4, wherein one of said first layer and second layer contains a polymerizable compound and a polymerizing initiator.
* * * * *